United States Patent [19]

Sakaguchi et al.

[11] Patent Number: 5,700,620
[45] Date of Patent: Dec. 23, 1997

[54] RADIATION RAY SENSITIVE RESIN COMPOSTION CONTAINING AT LEAST TWO DIFFERENT NAPHTHOQUINONEDIAZIDE SULFONIC ACID ESTERS AND AN ALKALI-SOLUBLE LOW-MOLECULAR COMPOUND

[75] Inventors: Shinji Sakaguchi; Toshiaki Aoai; Kenichiro Sato, all of Shizuoka, Japan

[73] Assignee: Fuji Photo Film Co., Ltd., Kanagawa, Japan

[21] Appl. No.: 676,917

[22] Filed: Jul. 8, 1996

Related U.S. Application Data

[63] Continuation of Ser. No. 362,924, Dec. 23, 1994, abandoned.

[30] Foreign Application Priority Data

Dec. 24, 1993  [JP]  Japan ..................... 5-346008

[51] Int. Cl.⁶ ................................................. G03F 7/023
[52] U.S. Cl. ..................... 430/191; 430/192; 430/193
[58] Field of Search ................................ 430/191, 192, 430/193

[56] References Cited

U.S. PATENT DOCUMENTS 5,340,688  8/1994  Kawabe et al. ................ 430/192
5,378,586  1/1995  Uetani et al. ................... 430/192

Primary Examiner—Christopher G. Young
Attorney, Agent, or Firm—Sughrue, Mion, Zinn, Macpeak & Seas, PLLC

[57] ABSTRACT

Disclosed is a radiation ray sensitive resin composition comprising a water-insoluble, alkali-soluble resin, a water-insoluble, alkali-soluble low-molecular compound and a radiation ray sensitive component, in which said radiation ray sensitive component contains a mixture composed of (A) a napthoquinonediazide sulfonic acid diester of water-insoluble, alkali-soluble low-molecular compounds having three and/or four phenolic hydroxyl groups and (B) a napthoquinonediazide sulfonic acid ester of a water-insoluble, alkali-soluble low-molecular compound having from 5 to 7 phenolic hydroxyl groups, in an amount of 30% or more of said radiation ray sensitive component. The composition is a positive type photoresist having a high resolution and small film thickness dependence. This has a broad latitude for development and leaves a small resist residue after development. This has high heat resistance and is therefore highly resistant to dry etching.

5 Claims, No Drawings

RADIATION RAY SENSITIVE RESIN COMPOSTION CONTAINING AT LEAST TWO DIFFERENT NAPHTHOQUINONEDIAZIDE SULFONIC ACID ESTERS AND AN ALKALI-SOLUBLE LOW-MOLECULAR COMPOUND

This is a Continuation of application Ser. No. 08/362,924 filed Dec. 23, 1994, now abandoned.

FIELD OF THE INVENTION

The present invention relates to a positive type photoresist composition sensitive to radiations such as ultraviolet rays, far-ultraviolet rays, X rays, electron rays, molecular beams, γ rays, synchrotron radiations, etc., which comprises a mixture composed of a water-insoluble, alkali-soluble novolak resin and a particular quinonediazide compound, and an additive of a water-insoluble, alkali-soluble low-molecular compound. More precisely, it relates to a photoresist composition to be used for forming fine photoresist patterns, having a high resolution irrespective of the variation in the thickness of the film to be made of the composition and having a broad latitude in development, while leaving a reduced residue after development.

The positive type photoresist of the present invention is coated on a substrate of semiconductor wafers, glass, ceramics, metals, etc., by spin coating, roller coating or the like coating methods, at a thickness of approximately from 0.5 to 3 μm. After thus coated, this is heated, dried and exposed to ultraviolet rays, etc., via an exposure mask, to form a circuit pattern or the like on the substrate. After thus exposed, this is baked, if desired, and then developed to give a positive image on the substrate. In addition, the substrate having the thus-formed positive image thereon is etched, using the positive image as a mask, to have a pattern thereon. One typical technical filed to which the photoresist is applied includes manufacture of semiconductor devices such as ICs, etc., manufacture of circuit substrates for liquid crystal displays, thermal heads, etc., manufacture of magnetic bubble memory devices, and other photofabrication processes.

BACKGROUND OF THE INVENTION

In conventional photofabrication processes for manufacturing semiconductor devices such as ICs, etc. and for manufacturing magnetic bubble memory devices, etc., radiation ray sensitive resin compositions have been employed. Above all, positive type photoresist compositions having a noticeably high resolution have been employed therein. Positive type photoresist compositions generally comprise an alkali-soluble resin binder such as novolaks, etc. and a naphthoquinonediazide compound as a photosensitive substance. For instance, there are described compositions comprising a novolak-type phenol resin and a naphthoquinonediazido-substituted compound, in U.S. Pat. Nos. 3,666,473, 4,115,128 and 4,173,470. As one typical example, there is described a composition comprising a novolak resin of cresol/formaldehyde and an ester of trihydroxybenzophenone/1,2-naphthoquinonediazido-sulfonic acid, in L. F. Thompson, *Introduction to Microlithography*, No. 219, pp. 112–121 (published by ACS Publishing Co.).

The binder, novolak resin, is soluble in an aqueous alkaline solution, without being swollen. In addition, it is highly resistant to plasma etching, when the formed image is used as a mask for etching. Therefore, novolak resins are especially advantageous as the binder in this use. The photosensitive substance, naphthoquinonediazide compound, acts by itself as a dissolution inhibitor capable of reducing the solubility of novolak resins in alkalies but, when exposed to light, specifically decomposes to give an alkali-soluble substance which rather increases the solubility of novolak resins in alkalies. Due to such significant variation in their properties relative to exposure to light, naphthoquinonediazide compounds are especially useful as photosensitive substances in positive type photoresists.

Because of these reasons, many positive type photoresists containing novolak resins and naphthoquinonediazide-based photosensitive components have heretofore been developed and put to practical use. In particular, the progress in resist materials toward higher resolution is remarkable in these days, and current resist materials have produced sufficient results in forming line patterns on a sub-micron level.

It has heretofore been said that resists having a high contrast (γ value) are advantageous for attaining an elevated resolution and reproducing pattern images with good profiles, and the technical development of resist compositions capable of satisfying the object has been made. There are known many patents and reports disclosing the related techniques. In particular, there are many patent applications relating to the technical improvements in novolak resins, which are the essential components in positive type photoresists, especially relating to their monomer compositions, their molecular weight distributions and the methods of producing them. Some of them have produced certain results.

It has already known to make novolak resins have particular molecular weight distributions so as to improve resists containing them. For instance, JP-A-1-105243 (the term "JP-A" as used herein means an "unexamined published Japanese patent application") mentions that novolak resins that have been designed to have a molecular weight falling within the range of from 500 to 5,000 at a proportion of 30% or less are preferred. JP-A-62-227144 and JP-A-63-2044 indicate preferred ranges for the molecular weight distributions of novolak resins, defining the proportions of the resins falling within the ranges of particular molecular weight distributions. In addition, there are described in JP-A-60-97347 and JP-A-60-189739 novolak resins from which low-molecular components have been removed by fractionation. In particular, JP-A-60-45238 mentions the use of novolak resins having a degree of dispersion of 3 or less, such as those to be used in the present invention.

Photosensitive substances are the other essential components in photoresists. Various structures of photosensitive substances which are said effective in obtaining a high contrast have been disclosed. For instance, *SPIE Proceedings*, Vol. 1672, pages 231 and 262 (1992) mentions the use of photosensitive substances having particular structures for producing photoresists having a high contrast. When positive photoresists are designed, utilizing these knowledges, then it will be possible to develop ultra-high-resolution resists capable of resolving patterns having a dimension in the same degree as that of the wavelength of light.

However, the degree of integration in integrated circuits is desired to be increased more and more in these days, and it has become necessary to produce ultra-fine patterns having a line width of 0.5 μm or less in the production of semiconductor substrates for ultra-LSIs. In such use, photoresists capable of obtaining an especially stable and high resolution and having a large latitude for development so as to always ensure constant line widths in the processed patterns are required. In addition, in order to prevent the processed circuits from having faults, it is desired that the developed resist patterns have no resist residue thereon.

Low-molecular compounds having aromatic hydroxyl group(s) are generally incorporated into photoresist compositions as dissolution accelerators so as to improve the sensitivity of the photoresists. There are known many examples of such compounds to be incorporated into photoresist compositions. However, when such compounds are added, the reduction in the thickness of the non-exposed areas in the films to be formed from the photoresists generally increases with the result that the profiles of the resist patterns are worsened. In addition, since the speed of development is accelerated due to the addition of such compounds, the latitude of the photoresists for development is generally lowered. Therefore, the selection of the structures of preferred compounds has been intended, while minimizing the amount of these compounds to be added to photoresists.

Regarding the etching system for photoresists, the conventional wet etching system is being changed into a dry etching system so as to elevate the degree of integration in integrated circuits. In the dry etching system, however, the temperature of the resists is elevated. Therefore, in order to prevent the resists from being thermally deformed due to the elevated temperature in the system, the resists are needed to have high heat resistance. To improve the heat resistance of resists, various techniques have been disclosed. For instance, resins not containing low-molecular fractions having a weight-average molecular weight of 2,000 or less are used (JP-A-60-97347), and resins having a content of monomers to trimers of being 10% by weight or less are used (JP-A-60-189739).

However, the use of the above-mentioned resins from which the low-molecular fractions had been removed or in which they had been reduced caused a problem in that the sensitivity of the photoresists was generally lowered so that the through-put in the production of devices was lowered.

It has also been attempted to add particular compounds to resist compositions so as to improve the sensitivity and the developability of the resists. For instance, there is disclosed in JP-A-61-141441 a positive type photoresist composition containing trihydroxybenzophenone. The positive type photoresist containing trihydroxybenzophenone has improved sensitivity and developability. However, the addition of trihydroxybenzophenone caused a problem in that the heat resistance of the composition was worsened so that the reduction in the thickness of the non-exposed area of the film to be formed from the photoresist was increased.

Therefore, the development of resists having a broad latitude for development and having high sensitivity, high resolution and high heat resistance has been desired.

In particular, in the formation of ultra-fine patterns having a line width of 0.5 μm or less, it has been known that, even though a photoresist film having a certain thickness could have a certain resolution, the resolution will often be lowered when the thickness of the photoresist film is varied only slightly. Such phenomenon will be hereinafter referred to as "film thickness dependence". Surprisingly, even when the thickness of a photoresist film is varied only in an amount of several microns×$10^{-2}$, the resolution of the film is noticeably varied. It has been found that all of typical positive type photoresists which are now commercially available involve much or less the problem. As concrete data, when the thickness of a resist film before exposure is varied in the range of λ/4n (where λ means the wavelength of light for exposure, and n means the refractive index of the resist film at said wavelength), relative to the pre-determined thickness thereof, then the resolution of the film varies according to the variation in its thickness.

In particular, it has been found that, when the contrast of a resist is desired to be increased so as to obtain a high resolution to give a resist pattern having rectangular, cross-sectional profiles, then the film thickness dependence becomes larger in many cases. When semiconductor substrates are practically produced, a resist film is coated on a substrate to have a delicately varying thickness in different portions, due to the rough surface of the substrate and due to the unevenness in coating the film, and the resist film is patterned. Therefore, in the technology of using positive type photoresists to form fine patterns at the highest possible resolution up to its limitation, the film thickness dependence will be one problem to be solved in future. The problem of the film thickness dependence has already been pointed out, for example, in *SPIE Proceedings*, Vol. 1925, page 626 (1993), which mentions that the problem is caused by the multi-reflecting effect of light in the resist film and is related with the hardly-solubilized surface of the resist film.

However, it has been quite unknown up to the present as to how the compositions of resist materials are designed so as to reduce the film thickness dependence and to obtain a high resolution irrespective of the thickness of the resist films. Since the film thickness dependence was said to be caused by the multi-reflection of light, we, the present inventors attempted to overcome the problem by adding dyes into resists but in vain. This was because the dyes added to resists caused the increase in the light absorption of the resists, after all lowering the resolution of the resists. Using the resists containing dyes, as a result, the cross-sectional profiles of the resist patterns formed therefrom became trapezoidal. Thus, the resists containing dyes were not suitable for forming fine patterns.

SUMMARY OF THE INVENTION

Accordingly, one object of the present invention is to provide a positive type photoresist for forming ultra-fine patterns, which has a high resolution and has a reduced degree of the above-mentioned "film thickness dependence". The "film thickness dependence" as referred to herein means the variation in the resolution of a resist to be caused by the variation in the thickness of the resist film, before its exposure, within the range of λ/4n.

Another object of the present invention is to provide a positive type photoresist which has a broad latitude for development and which hardly leaves its residue after development. The latitude for development as referred to herein may be represented by the development time dependence or the temperature dependence of the line width of the resist pattern to be formed after development and the sensitivity of the resist to be developed and patterned. The resist residue after development indicates a slight amount of insoluble resist components remained between the lines of fine patterns formed after development.

Still another object of the present invention is to provide a photoresist having high heat resistance, which is therefore highly resistant to dry etching.

We, the present inventors, paying attention to the above-mentioned various characteristics of photoresists, assiduously studied various components constituting photoresists and, as a result, have found that the above-mentioned objects may be attained by a radiation ray sensitive resin composition comprising a water-insoluble, alkali-soluble resin, a water-insoluble, alkali-soluble low-molecular compound and a radiation ray sensitive component, in which said radiation ray sensitive component contains a mixture composed of (A) a naphthoquinonediazide sulfonic acid diester of water-insoluble, alkali-soluble low-molecular compounds having three and/or four phenolic hydroxyl groups and (B) a napthoquinonediazide sulfonic acid ester of a water-insoluble, alkali-soluble low-molecular compound having from 5 to 7 phenolic hydroxyl groups, in an amount of 30% or more of said radiation ray sensitive component. On the basis of this finding, we have completed the present invention.

The relation between the prior art which constitutes a part of the constitutive requirements in the present invention and the present invention will be described below.

Some of the skeleton compounds, radiation ray sensitive compounds (A), to be used in the present invention are known, as described in, for example, U.S. Pat. No. 5,178, 986, JP-A-2-296249, JP-A-2-296248, etc. However, the photosensitive components described therein consist essentially and substantially of complete esters of naphthoquinonediazido-sulfonic acids esterified with phenolic hydroxyl groups. Positive type photoresists containing the esters along with water-insoluble, alkali-soluble resins and water-insoluble, alkali-soluble low-molecular compounds had problems in that they left significant residues after development and had a narrow latitude for development, and, in addition, they had large film thickness dependence and poor heat resistance.

Being different from such positive type photoresists, the radiation ray sensitive resin composition of the present invention, comprising a water-insoluble, alkali-soluble resin, a water-insoluble, alkali-soluble low-molecular compound and a radiation ray sensitive component, is characterized in that said radiation ray sensitive component contains a mixture composed of (A) a naphthoquinonediazide sulfonic acid diester of particular, water-insoluble, alkali-soluble low-molecular compounds having three and/or four phenolic hydroxyl groups and (B) a napthoquinonediazide sulfonic acid ester of a particular, water-insoluble, alkali-soluble low-molecular compound having from 5 to 7 phenolic hydroxyl groups, in an amount of 30% or more of the total of said radiation ray sensitive component. Specifically, the effect of the present invention is attained only when the radiation ray sensitive component in the composition of the invention satisfies the above-mentioned requirement.

Accordingly, when the mixture of these radiation ray sensitive compounds is combined with the water-insoluble, alkali-soluble resin and the water-insoluble, alkali-soluble low-molecular compounds, according to the present invention, then the resolution of the resist is improved to the intended degree due to the proper balance between the alkali dissolution inhibiting effect of the radiation ray sensitive compounds and the alkali dissolution promoting effect of the photolysates derived from the compounds, while, though quite surprisingly, the combination of the compounds gives a broader latitude for development and more reduced film thickness dependence than the single use of either one of them. Moreover, we, the present inventors, have further found that the heat resistance of the radiation ray sensitive resin composition of the present invention, characterized by having the combination of such two radiation ray sensitive compounds has much been improved, though the heat resistance of known photoresists containing, as the radiation ray sensitive compound, only a naphthoquinonediazide sulfonic acid diester of particular, water-insoluble, alkali-soluble low-molecular compounds having three and/or four phenolic hydroxyl groups was poor.

DETAILED DESCRIPTION OF THE INVENTION

Embodiments of the present invention will be described in detail hereunder.

The radiation ray sensitive compound (A) to be employed in the present invention is a naphthoquinonediazide sulfonic acid diester of water-insoluble, alkali-soluble low-molecular compounds having three and/or four phenolic hydroxyl groups, and this is preferably selected from naphthoquinonediazide sulfonic acid diester of the following general formulae (A1) to (A4):

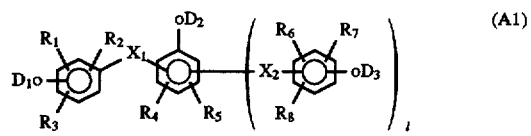

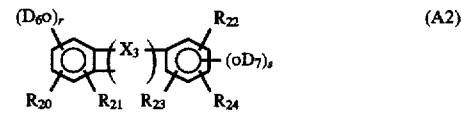

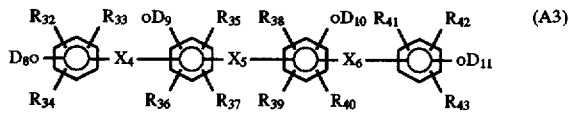

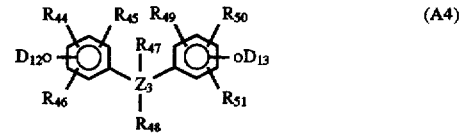

In these formulae, $R_1$ to $R_8$ and $R_{20}$ to $R_{24}$ each represent a hydrogen atom, —CN, —X—$R_{a1}$ or a halogen atom. If the compounds have higher alkyl groups, the film thickness dependence of the photoresist composition will be increased and the resist residue after development will be large. Therefore, these groups in the compounds each are preferably a hydrogen atom, an alkyl group having from 1 to 4 carbon atoms, an alkoxy group having from 1 to 4 carbon atoms or a cycloalkyl group having from 5 to 7 carbon atoms, especially preferably a hydrogen atom, a methyl group, an ethyl group or a methoxy group.

$X_1$ and $X_2$ each represent a single bond, a carbonyl group, a sulfido group, a sulfonyl group, or —C($R_{b1}$)($R_{b2}$)—; provided that, when 1 is 0, then $X_1$ represents a group of the following general formula ($A_{11}$) or ($A_{12}$):

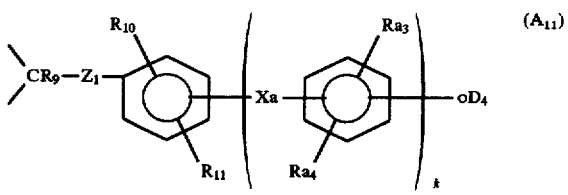

-continued

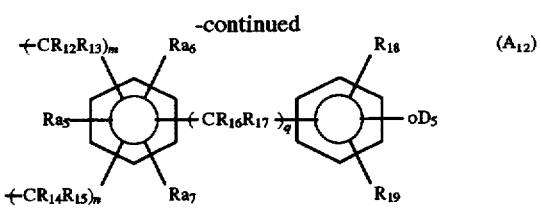

(A12)

$X_3$ represents a group of the following general formula (A21) or (A22):

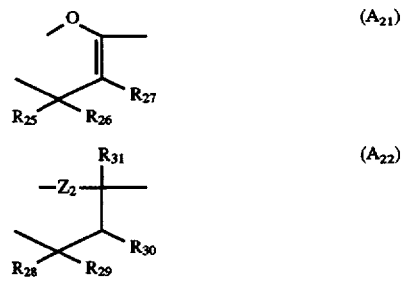

Of the two, preferred is a group of formula (A22).

$R_9$, $R_{12}$ to $R_{17}$, $R_{25}$ to $R_{31}$, $R_{b1}$ and $R_{b2}$ each represent a hydrogen atom, a methyl group, an ethyl group, or a haloalkyl group having one or two carbon atoms. $R_{b1}$ and $R_{b2}$; $R_{25}$ and $R_{26}$; $R_{28}$ and $R_{29}$; and $R_{30}$ and $R_{31}$ each may be bonded to each other to form an alicyclic hydrocarbon residue.

Of these groups, preferred are a hydrogen atom and a methyl group, from the viewpoint of reducing the film thickness dependence of the resist film and reducing the resist residue after development.

$R_{10}$, $R_{11}$, $R_{a3}$, $R_{a4}$, $R_{18}$ and $R_{19}$ each represent a hydrogen atom, —X—$R_{a1}$, —CN or a halogen atom. Preferably, they each are a hydrogen atom, an alkyl group having from 1 to 4 carbon atoms, a cycloalkyl group having from 5 to 7 carbon atoms or an alkoxy group having from 1 to 4 carbon atoms, especially preferably a hydrogen atom, a methyl group, an ethyl group or a methoxy group.

X represents a single bond, —O—, —S—, —CO—, —OCO—, or —N($R_{a1}$)—CO—.

Xa represents a carbonyl group, a sulfido group, a sulfonyl group, or —C($R_{b1}$)($R_{b2}$)—.

In view of the solubility of the radiation ray sensitive compound (A) in solvents, the cost of the compound (A) and the easiness in the industrial production of the compound (A), $X_1$, $X_2$ and Xa each are preferably a sulfido group, a sulfonyl group, or —C($R_{b1}$)($R_{b2}$)—, and when 1 is 0, $X_1$ is preferably a group of the above-mentioned formula (A11) or (A12).

$R_{a1}$ represents an alkyl, aryl or aralkyl group having from 1 to 10 carbon atoms.

$Z_1$ represents a single bond, or it is bonded to $CR_9$ to form a tri-valent alicyclic hydrocarbon residue. Preferably, it is a single bond.

$Z_2$ represents a single bond, or —O—. It is preferably —O—.

k and l each represent 0 or 1.

m and n each represent 1 or 2.

q represents a integer of from 1 to 8.

Preferably, k and l are both 1; and m, n and q are all 1.

r and s each represent 1 or 2, provided that (r+s) is 3.

$D_1$ to $D_7$ each represent a hydrogen atom, or a naphthoquinonediazido-4 or 5-sulfonyl group.

$R_{32}$ to $R_{46}$ and $R_{49}$ each represent a hydrogen atom, —CN, —X—$R_{a1}$, or a halogen atom. If the compounds have higher alkyl groups, the film thickness dependence of the photoresist composition will be increased and the resist residue after development will be large. Therefore, these groups in the compounds each are preferably a hydrogen atom, an alkyl group having from 1 to 4 carbon atoms, a cycloalkyl group having from 5 to 7 carbon atoms, an alkoxy group having from 1 to 4 carbon atoms or a chlorine atom, especially preferably a hydrogen atom, a methyl group, an ethyl group or a methoxy group.

$R_{47}$ represents a hydrogen atom, a methyl group, an ethyl group, a haloalkyl group having one or two carbon atoms, or Rc. Preferably, it is a hydrogen atom, a methyl group or Rc.

Rc represents a group of the following general formula (A41):

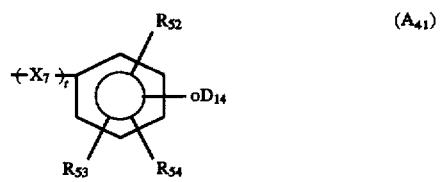

$R_{48}$ represents a hydrogen atom, a methyl group, an ethyl group, a haloalkyl group having one or two carbon atoms, or Rd. Preferably, it is a hydrogen atom, a methyl group or Rd.

Rd represents a group of the following general formula (A42):

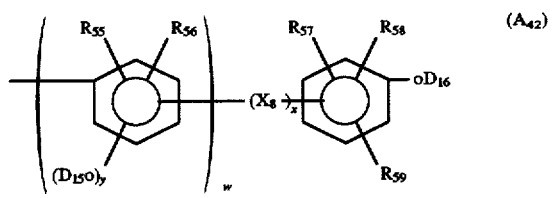

$R_{50}$ and $R_{51}$ each represent a hydrogen atom, —CN, —X—$R_{a1}$, or a halogen atom; provided that, when $R_{47} \neq Rc$ and $R_{48} \neq Rd$, then they each are Rc.

Preferably, they each are a hydrogen atom, a methyl group or a methoxy group.

$X_4$ to $X_6$ each represent a single bond, a carbonyl group, a sulfido group, a sulfonyl group, or —C($R_{b1}$)($R_{b2}$)—. In view of the solubility of the radiation ray sensitive compound (A) in solvents, the cost of the compound (A) and the easiness in the industrial production of the compound (A), these each are preferably a sulfido group, a sulfonyl group, or —C($R_{b1}$)($R_{b2}$)—.

$X_7$ and $X_8$ each represent a single bond, or a group of —(CR$_{60}$R$_{61}$)$_u$(CH=CH)$_v$—.

$R_{52}$ to $R_{59}$ each represent a hydrogen atom, —CN, —X—$R_{a1}$, or a halogen atom. Preferably, these each are a hydrogen atom, a methyl group or a methoxy group.

$R_{60}$ and $R_{61}$ each represent a hydrogen atom, a methyl group, an ethyl group, or a haloalkyl group having one or two carbon atoms. Preferably, these each are a hydrogen atom or a methyl group.

$Z_3$ represents a tetra-valent alkyl residue having from 1 to 6 carbon atoms. Preferably, it is a carbon atom.

$D_8$ to $D_{16}$ each represent a hydrogen atom, or a naphthoquinonediazido-4 or 5-sulfonyl group.

t represents 0 or an integer of 1 or 2.

u and x each represent 0 or an integer of from 1 to 8.

Preferably, t is 0 or 1; and u and x each are 0 or an integer of from 1 to 4.

y, v and w each represent 0 or 1; provided that, when $R_{47} \neq Rc$ and $R_{50} \neq Rc$ and $R_{51} \neq Rc$, there y=1 and w=1, while in the other cases, y=0.

In these radiation ray sensitive compounds of formulae (A1) to (A4), two of $D_1$ to $D_{16}$ are naphthoquinonediazido-4 or 5-sulfonyl groups in one molecule.

$R_{a5}$, $R_{a6}$ and $R_{a7}$ each represent a hydrogen atom, $-X-R_{a1}$, —CN, or a halogen atom. Preferably, these each are a hydrogen atom, an alkyl group having from 1 to 4 carbon atoms or an alkoxy group having from 1 to 4 carbon atoms.

Of these radiation ray sensitive compounds of formulae (A1) to (A4), those of formulae (A1), (A3) and (A4) are preferred. In particular, those of formula (A1) where l=1 are especially preferred.

Specific examples of the radiation ray sensitive compound (A) for use in the present invention are mentioned below, which, however, are not whatsoever limitative.

In the following compounds, D means a hydrogen atom, or a naphthoquinonediazido-4 or 5-sulfonyl group.

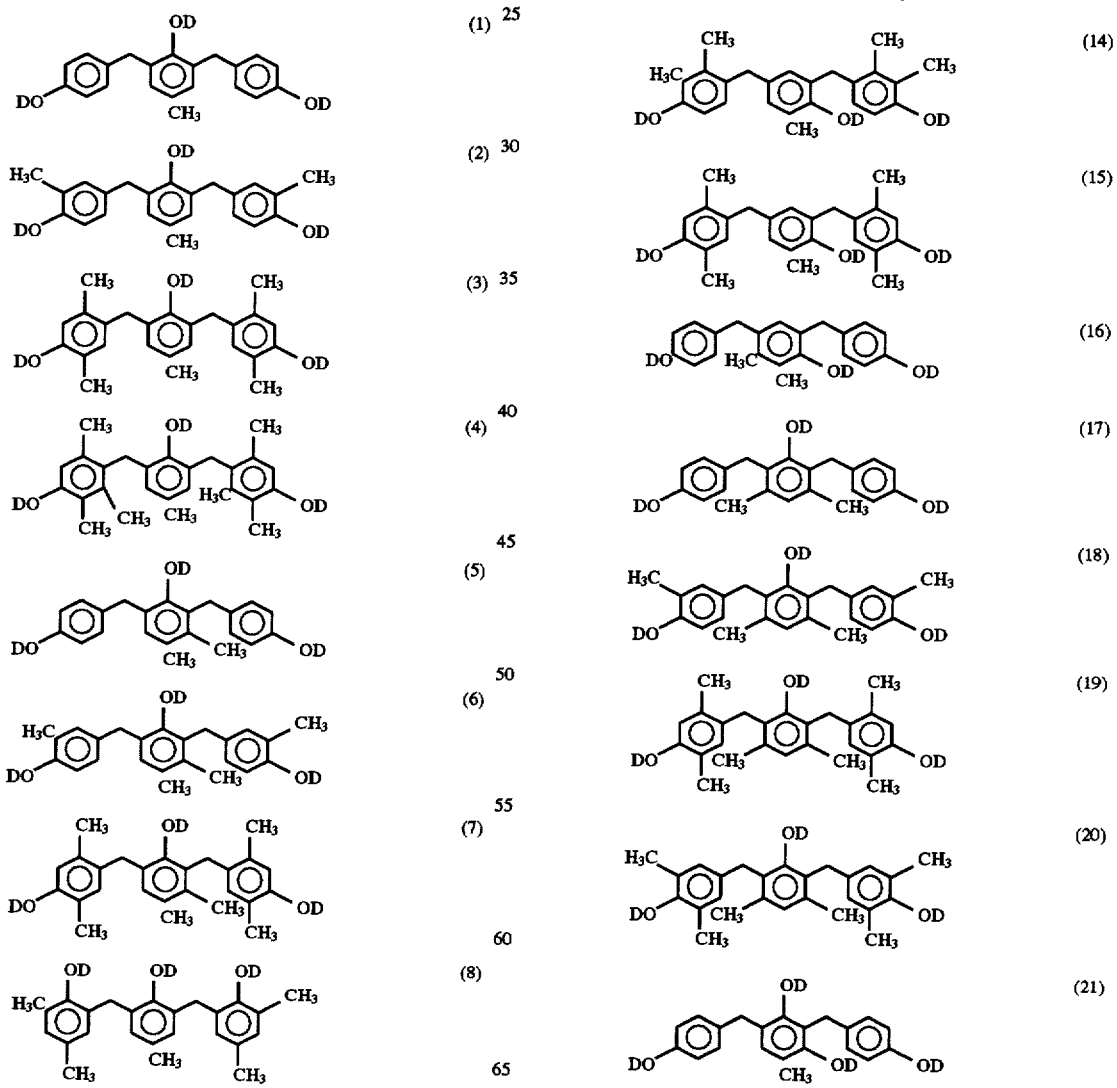

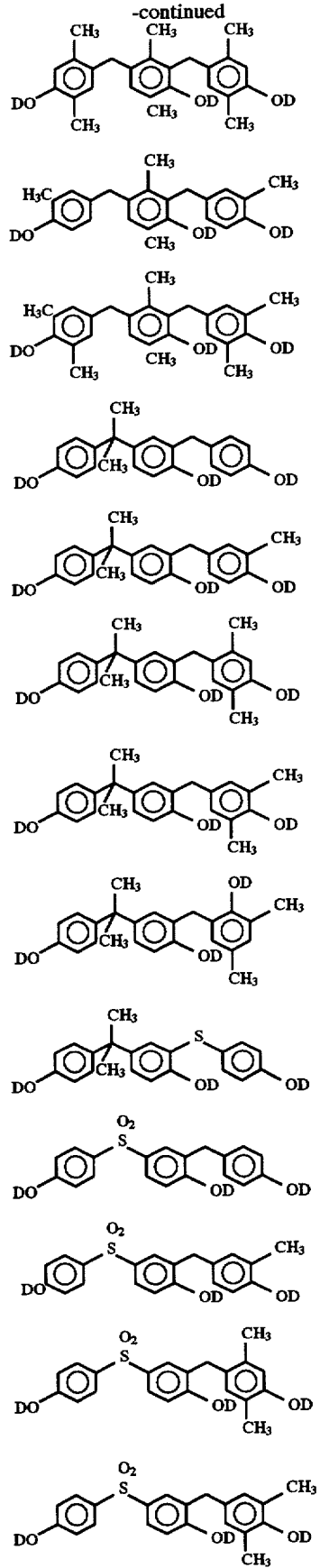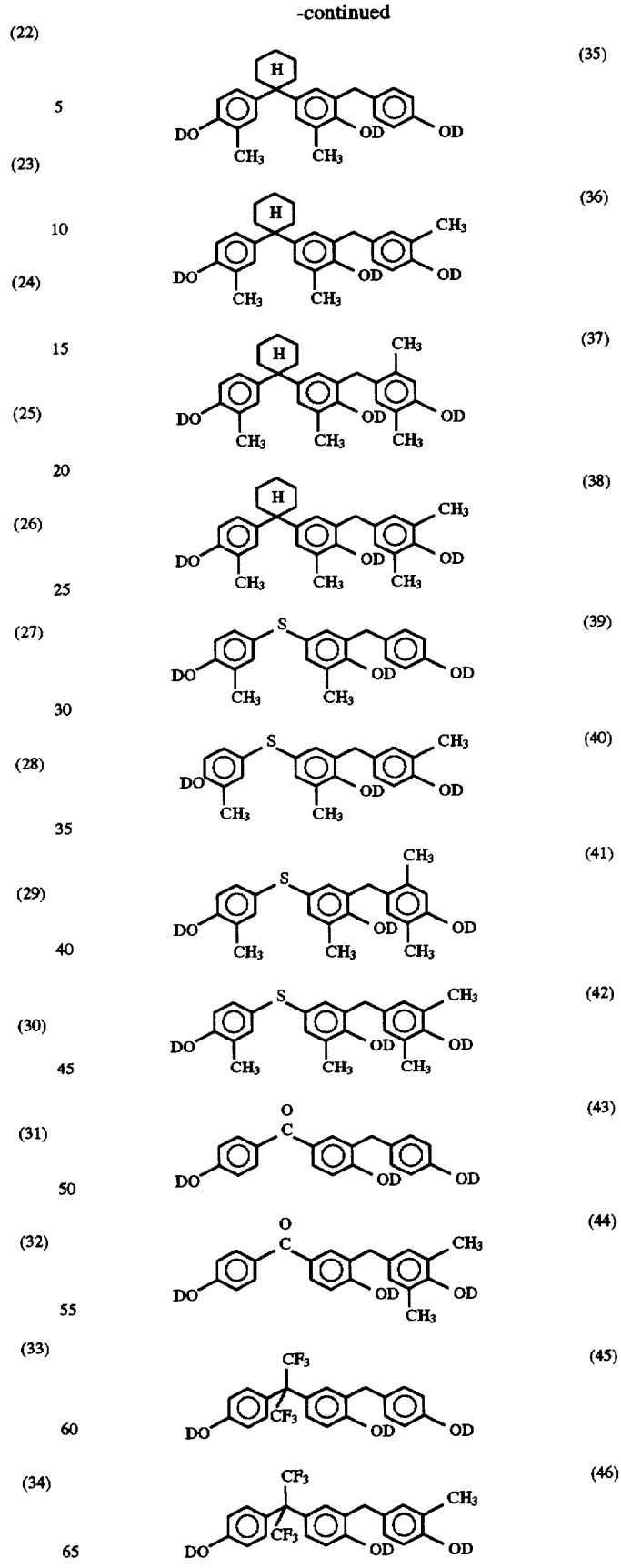

-continued
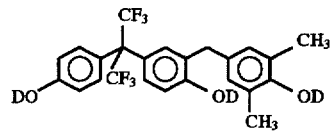 (47)
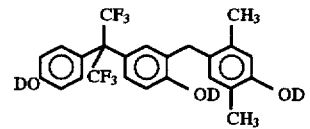 (48)
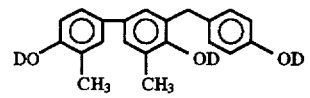 (49)
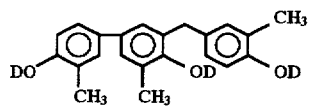 (50)
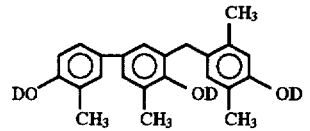 (51)
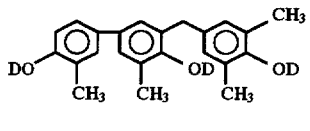 (52)
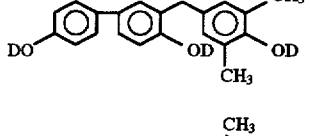 (53)
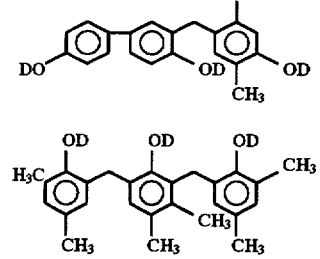 (54)
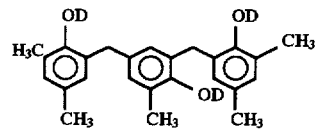 (55)
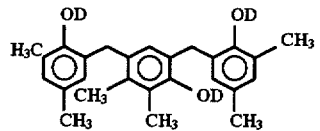 (56)
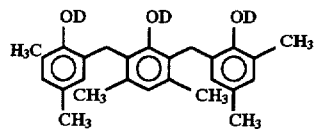 (57)
(58)
-continued
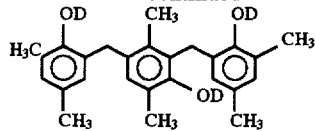 (59)
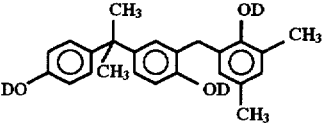 (60)
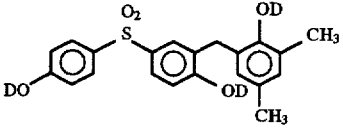 (61)
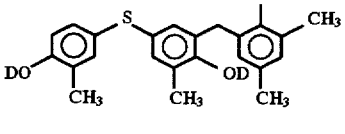 (62)
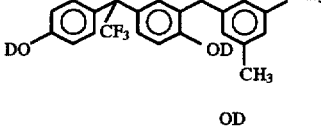 (63)
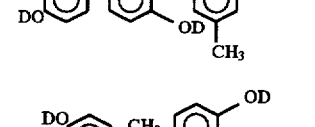 (64)
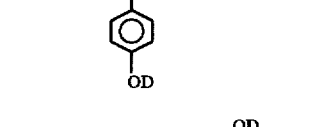 (65)
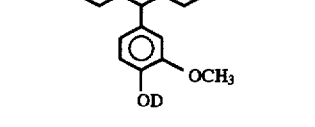 (66)
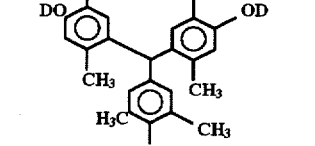 (67)
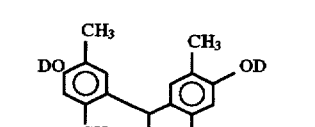 (68)

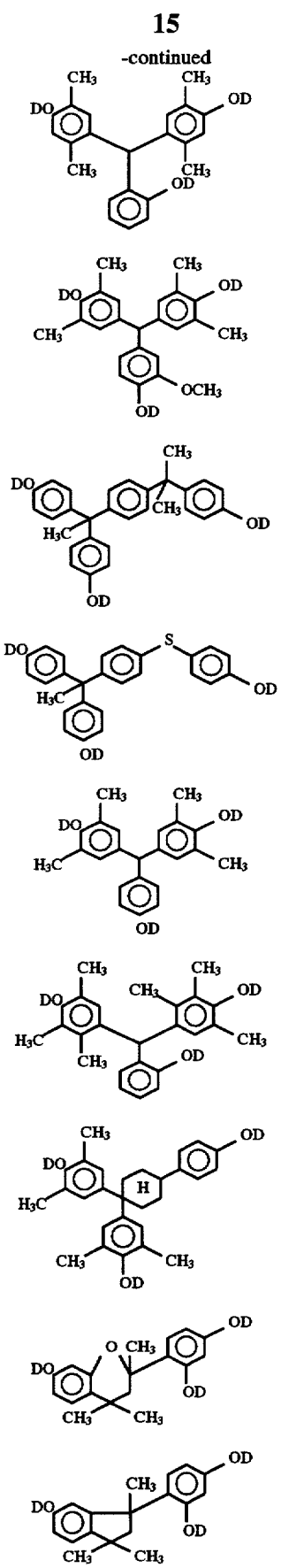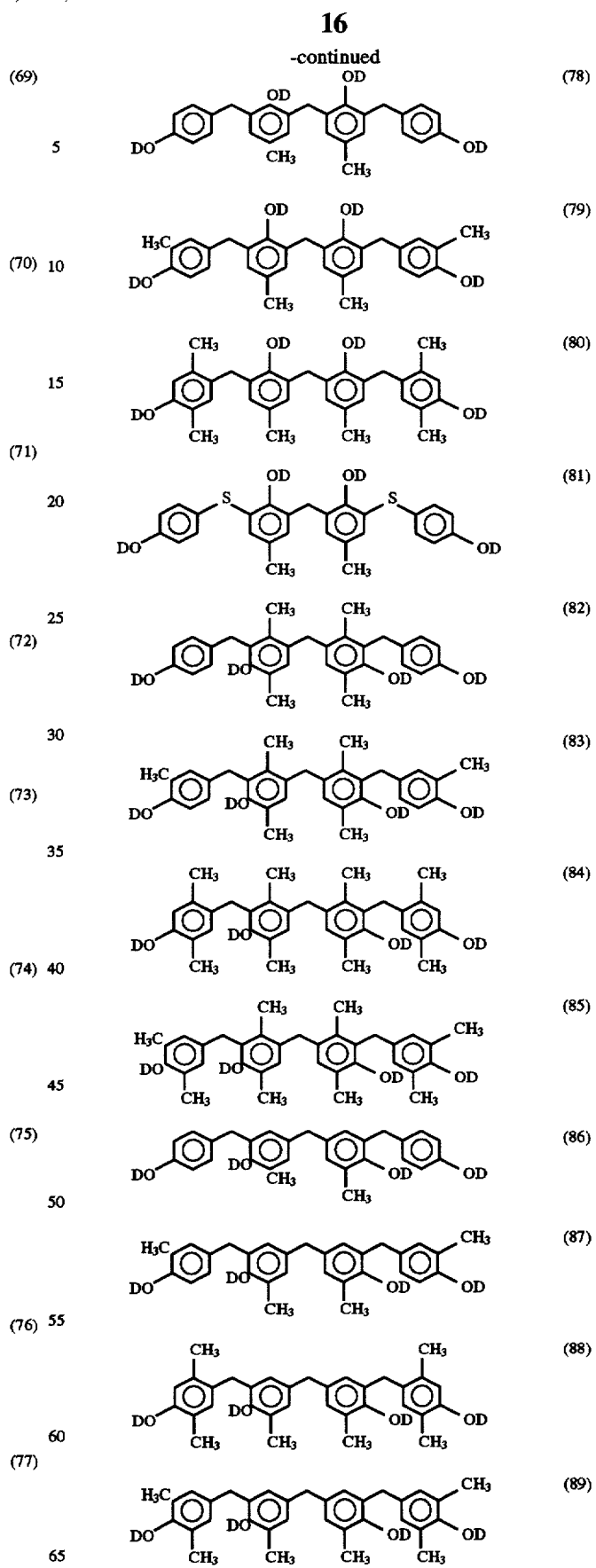

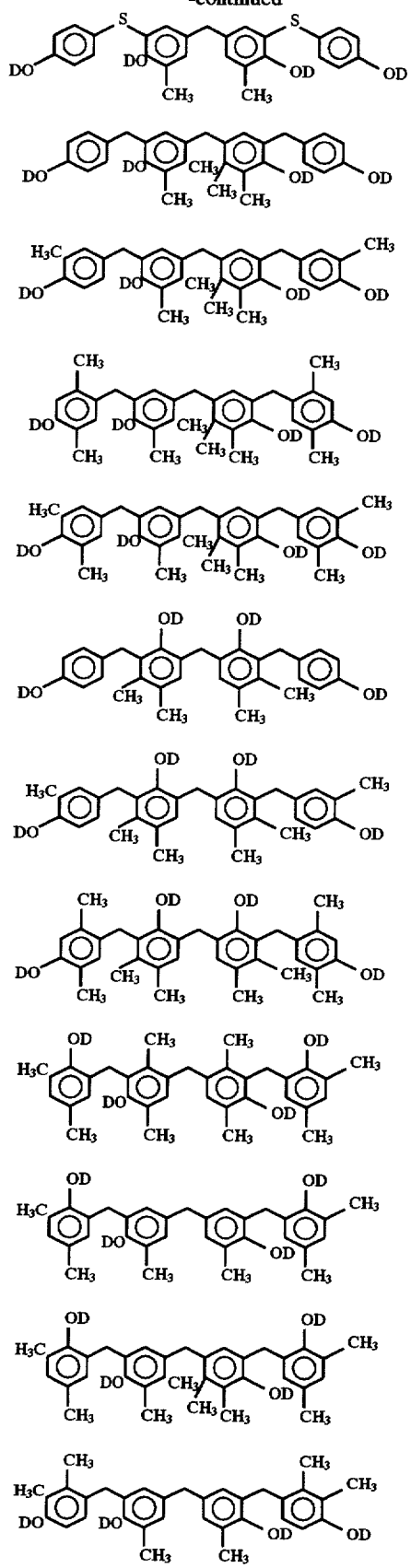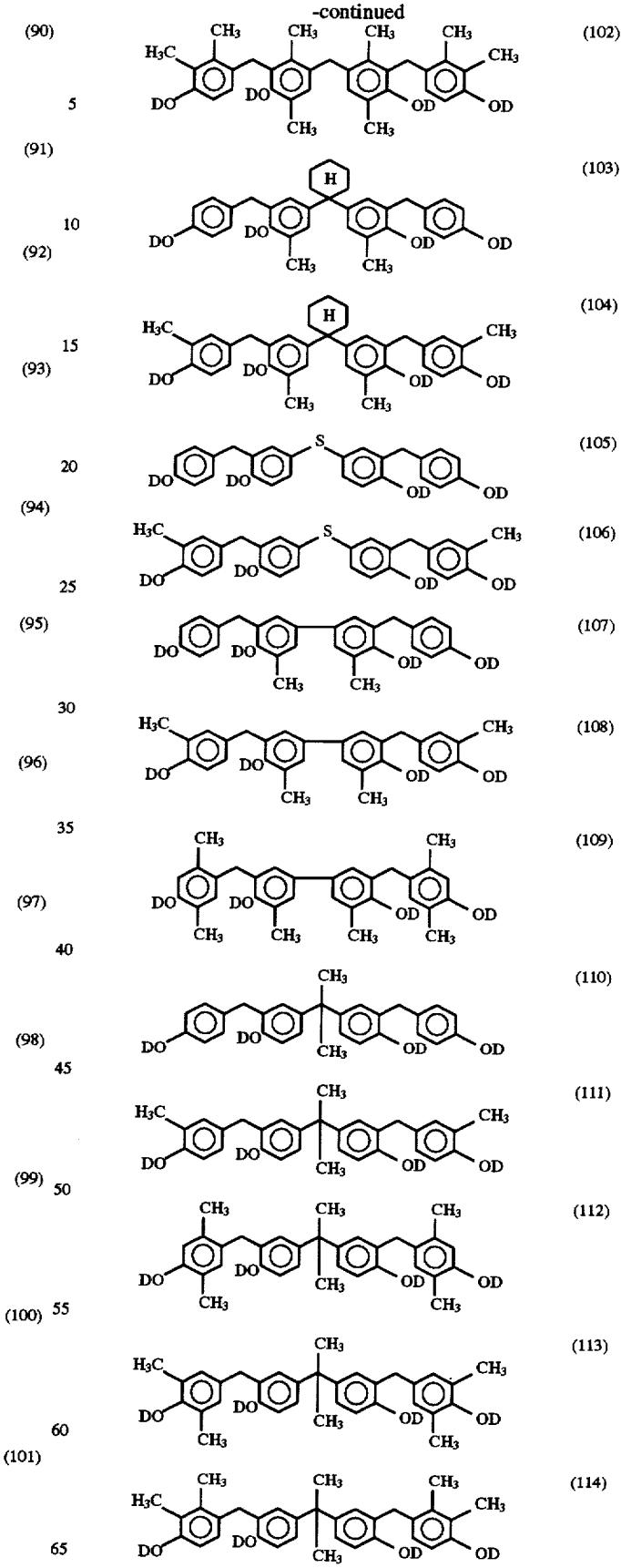

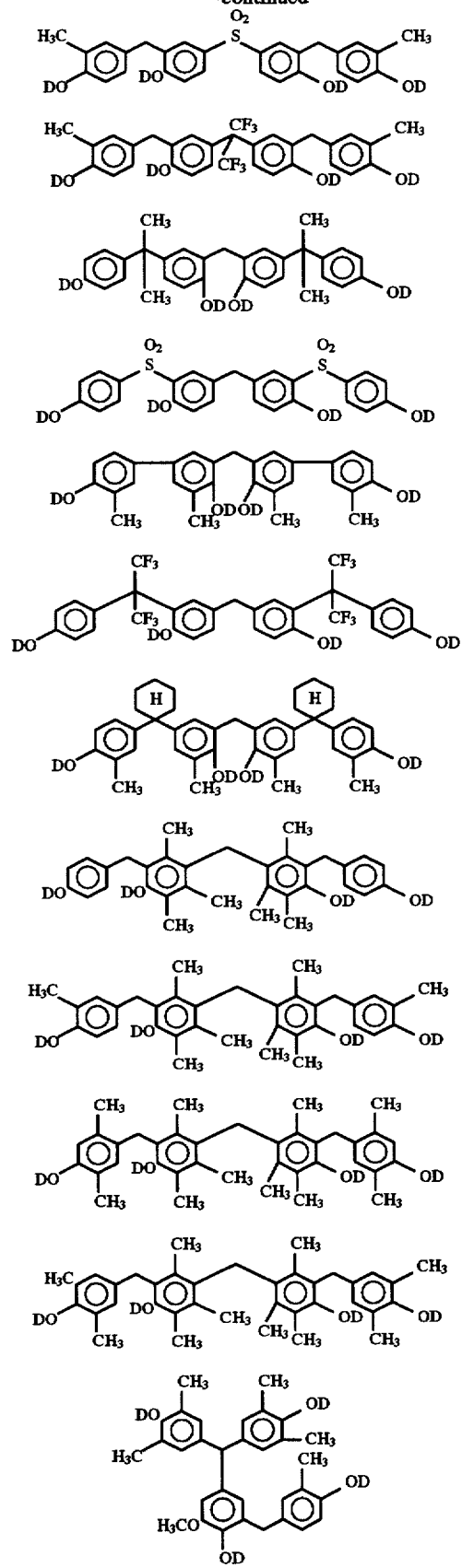

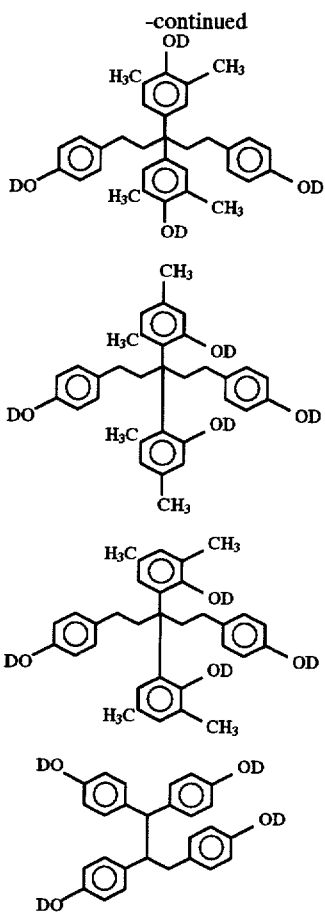

The radiation ray sensitive compound (B) to be employed in the present invention is a naphthoquinonediazide sulfonic acid ester of a water-insoluble, alkali-soluble low-molecular compound having from 5 to 7 phenolic hydroxyl groups, and this is preferably selected from naphthoquinonediazide sulfonic acid ester of the following general formula (B1):

these groups in the compounds each are preferably a hydrogen atom, an alkyl group having from 1 to 4 carbon atoms, a cycloalkyl group having from 5 to 7 carbon atoms, an alkoxy group having from 1 to 4 carbon atoms or a chlorine atom, especially preferably a hydrogen atom, a methyl group, an ethyl group or a methoxy group.

$X_9$ to $X_{14}$ each represent a single bond, a carbonyl group, a sulfido group, a sulfonyl group, or a group of —$C(R_{b1})(R_{b2})$—. In view of the solubility of the radiation ray sensitive compound (B) in solvents, the cost of the compound (B) and the easiness in the industrial production of the compound (B), these each are preferably a single bond, a sulfido group, a sulfonyl group, or —$C(R_{b1})(R_{b2})$—.

$D_{17}$ to $D_{23}$ each represent a hydrogen atom, or a naphthoquinonediazido-4 or 5-sulfonyl group.

The proportion of the naphthoquinonediazido-4 or 5-sulfonyl groups in all these substituents of $D_{17}$ to $D_{23}$ is preferably from 10 to 60%, more preferably from 20 to 50%. This is because, if the proportion is too large, the sensitivity of the compound will lower, the resist residue after development will increase and the profiles of the resist patterns formed will be bad.

$R_{a1}$ represents an alkyl, aryl or aralkyl group having from 1 to 10 carbon atoms.

$R_{b1}$ and $R_{b2}$ each represents a hydrogen atom, a methyl group, an ethyl group, or a haloalkyl group having one or two carbon atoms. $R_{b1}$ and $R_{b2}$ may be bonded to each other to form an alicyclic hydrocarbon residue.

i and j each represent 0 or 1, provided that (i+j) is preferably 1 or 0.

In the radiation ray sensitive compounds to be in the photoresist composition of the present invention, the naphthoquinonediazide sulfonic acid ester residues are especially preferably in the terminals of the molecular chain. This is because such compounds are satisfactorily effective in inhibiting the dissolution of water-insoluble, alkali-soluble resins, the residue of the photoresist composition after development is reduced and the photoresist composition has a high resolution.

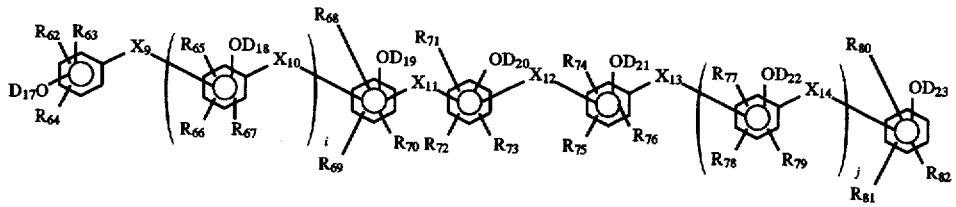

In formula (B1), $R_{62}$ to $R_{82}$ each represent a hydrogen atom, —CN, —X—$R_{a1}$, or a halogen atom. If the compounds have higher alkyl groups, the film thickness dependence of the photoresist composition will be increased and the resist residue after development will be large. Therefore, Specific examples of the radiation ray sensitive compound (B) for use in the present invention are mentioned below, which, however, are not whatsoever limitative.

In the following compounds, D means a hydrogen atom, or a naphthoquinonediazido-4 or 5-sulfonyl group.

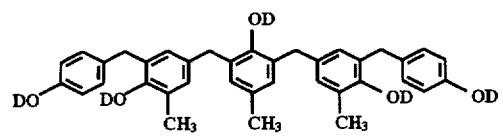
(139)
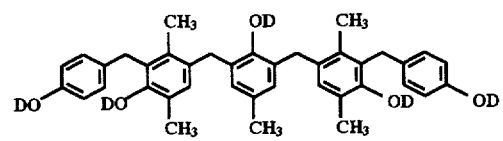
(140)
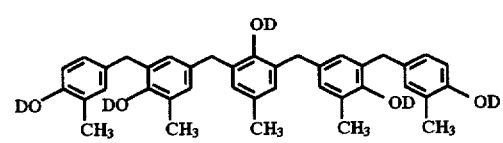
(141)
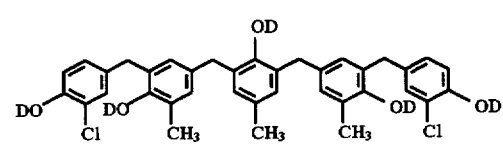
(142)
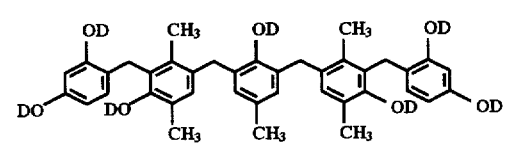
(143)
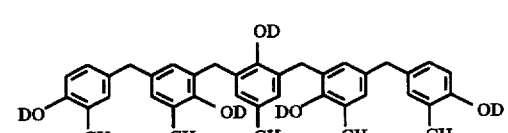
(144)
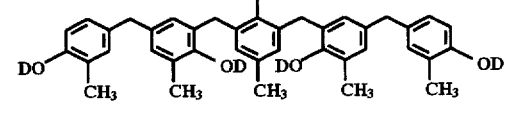
(145)
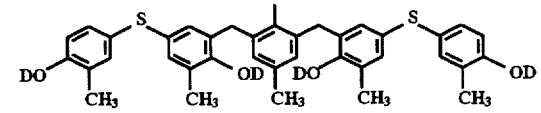
(146)
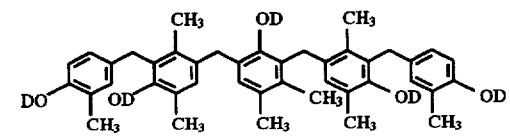
(147)
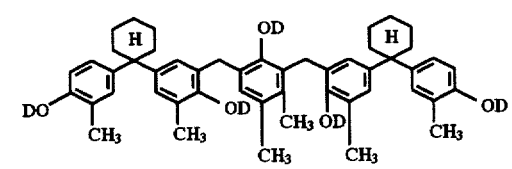
(148)
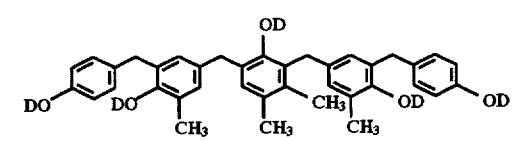
(149)
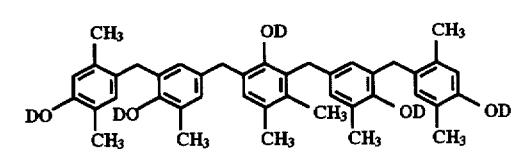

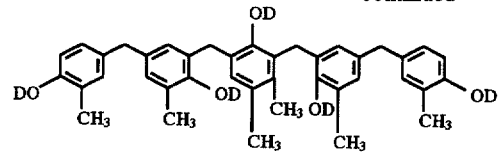 (150)
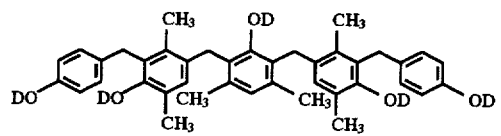 (151)
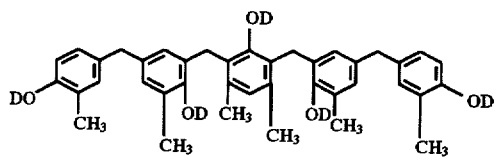 (152)
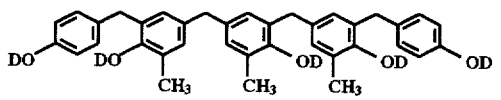 (153)
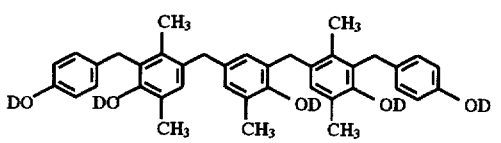 (154)
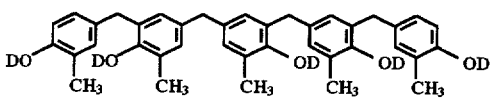 (155)
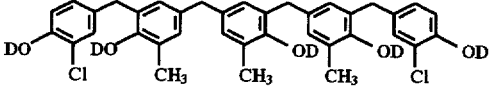 (156)
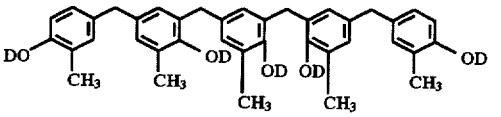 (157)
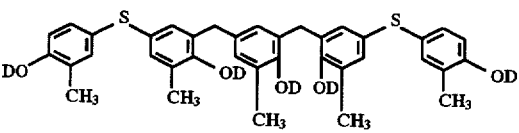 (158)
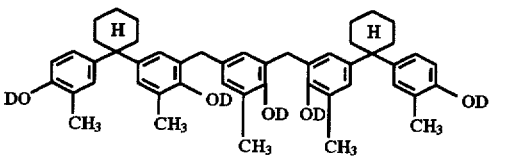 (159)
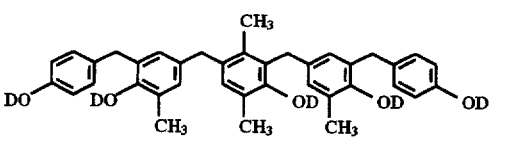 (160)
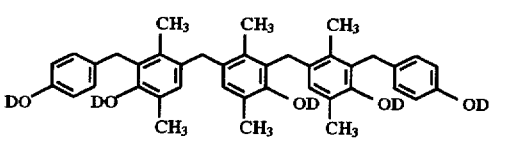 (161)

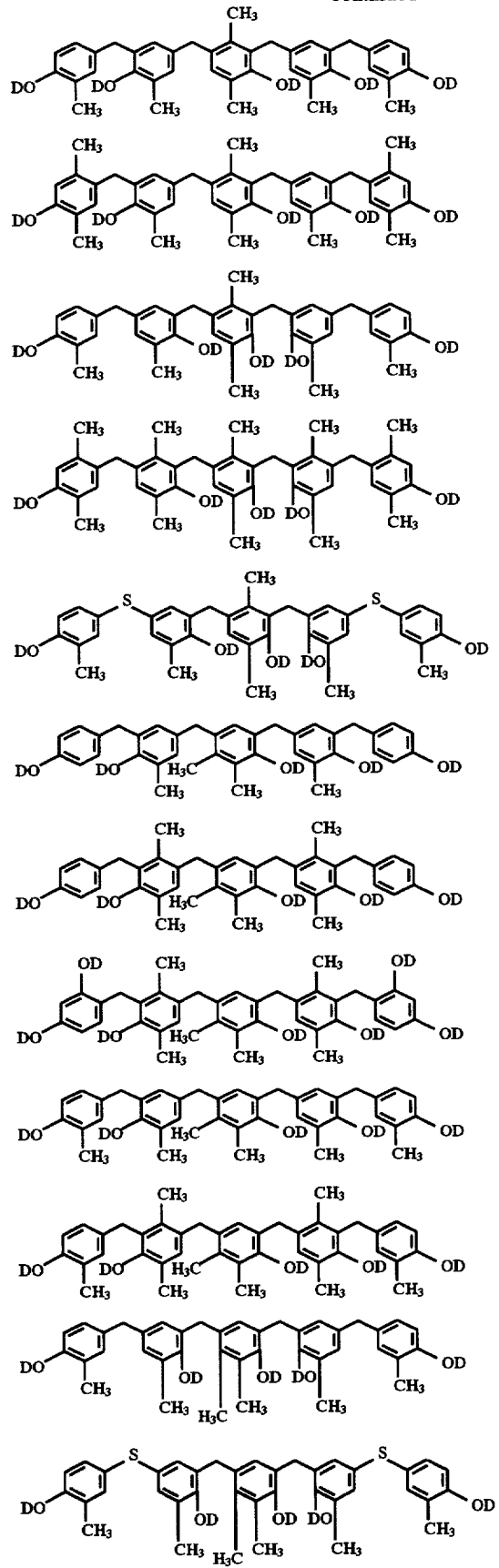

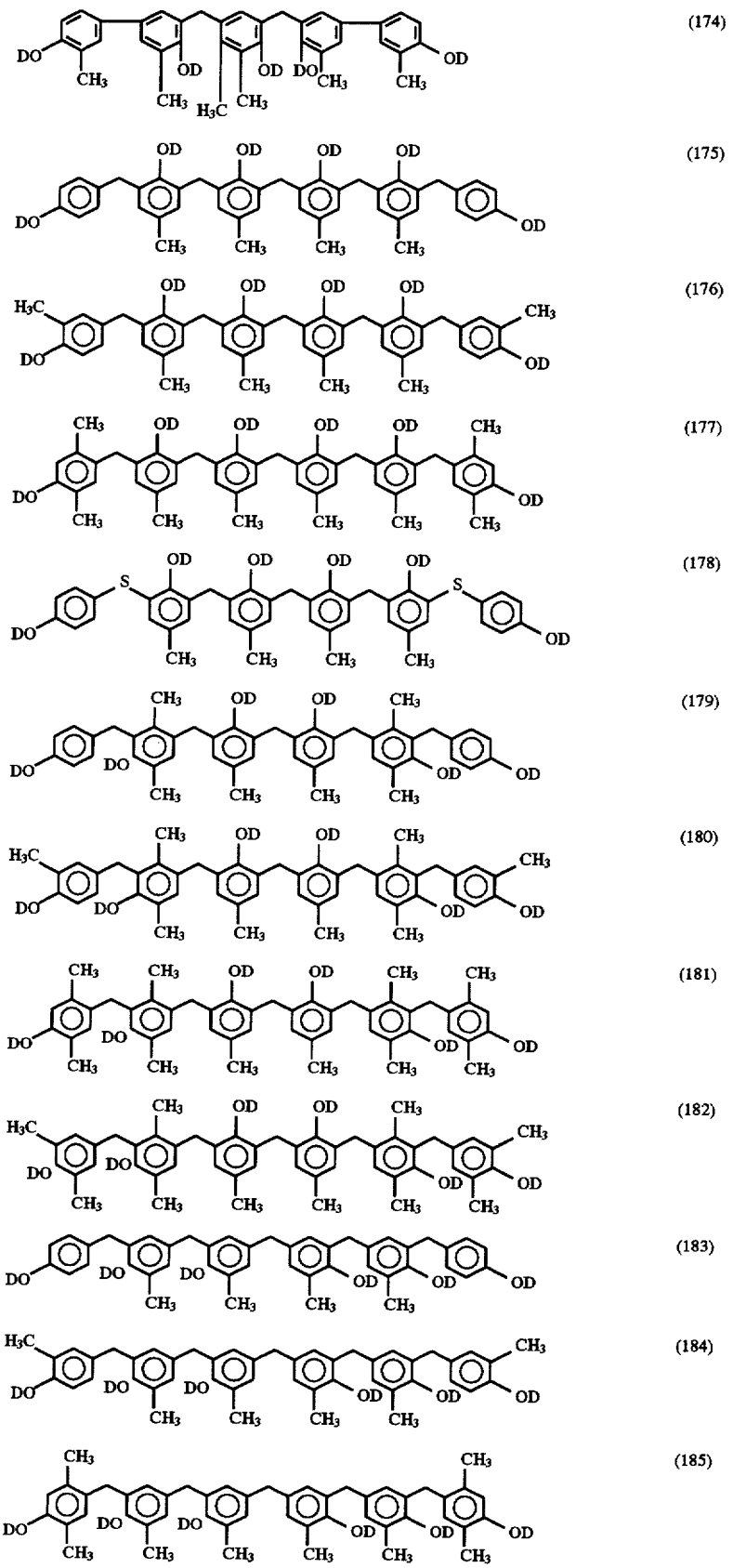

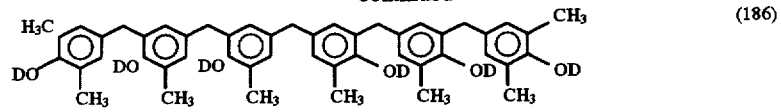
(186)
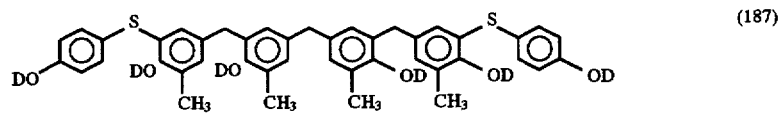
(187)
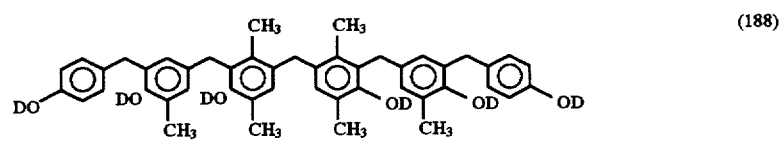
(188)
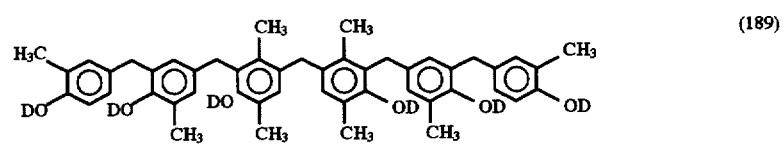
(189)
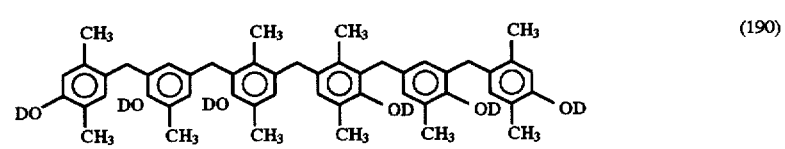
(190)
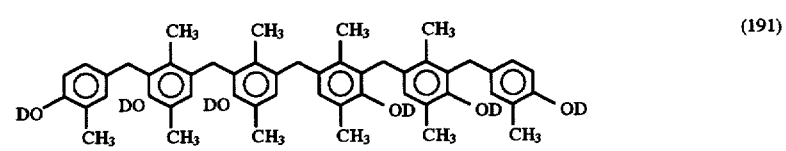
(191)
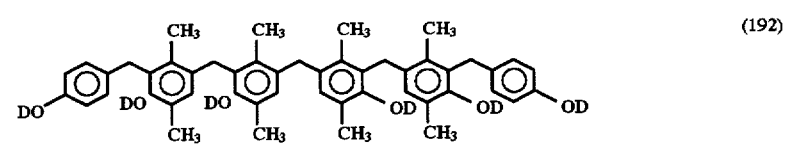
(192)
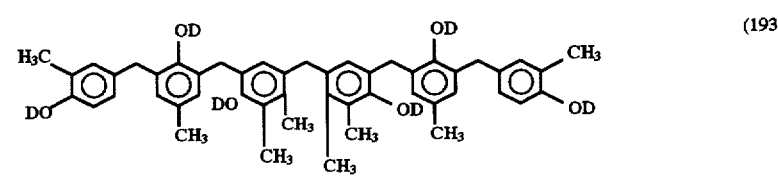
(193)
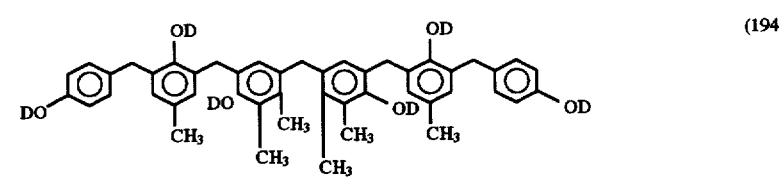
(194)
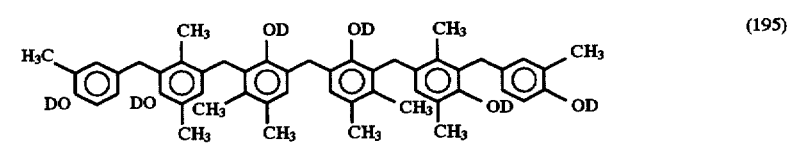
(195)
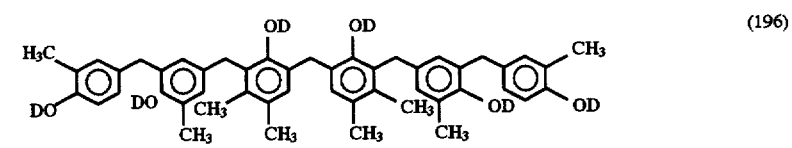
(196)

-continued
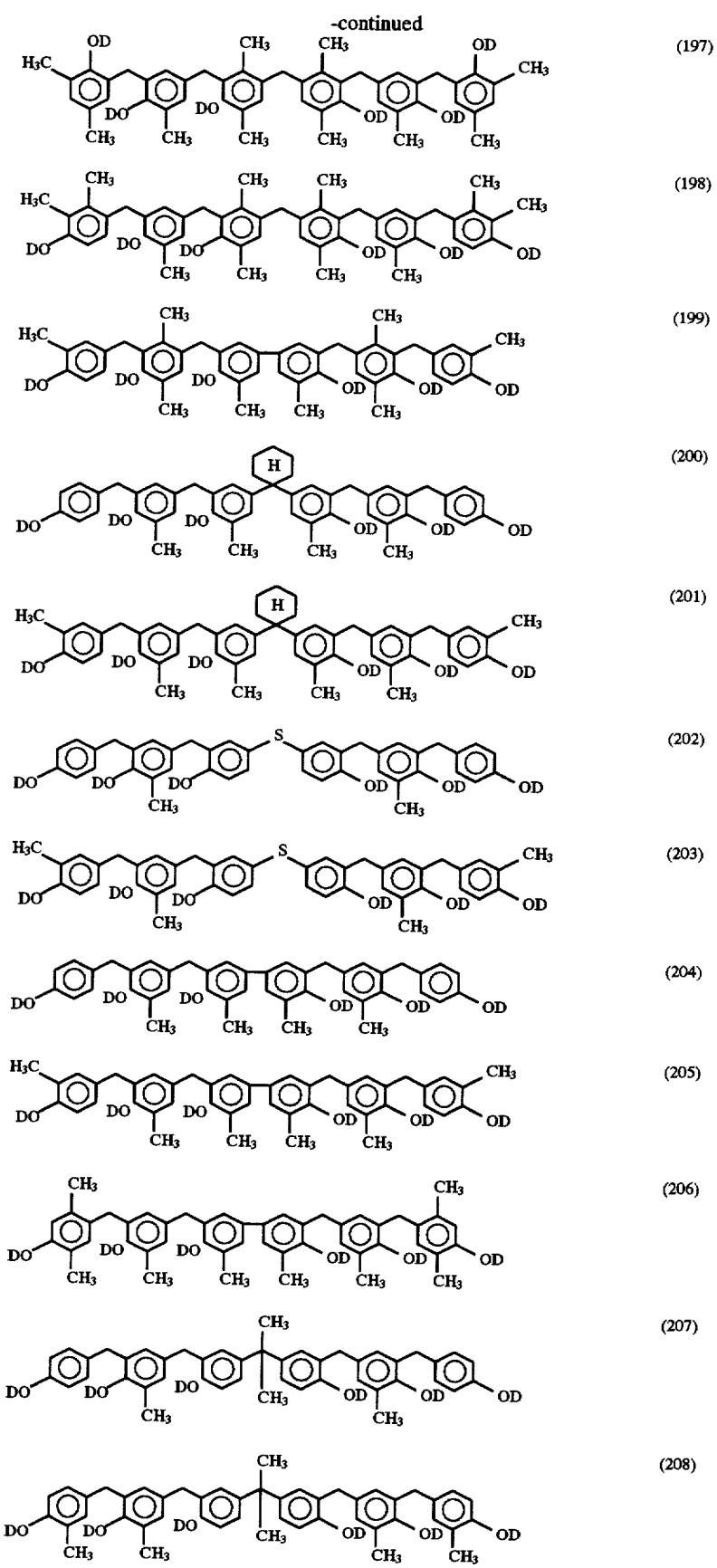
(197)
(198)
(199)
(200)
(201)
(202)
(203)
(204)
(205)
(206)
(207)
(208)

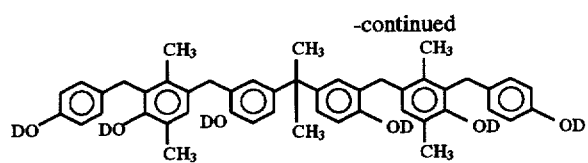 (209)
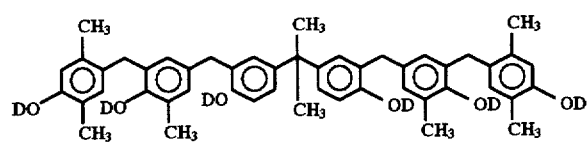 (210)
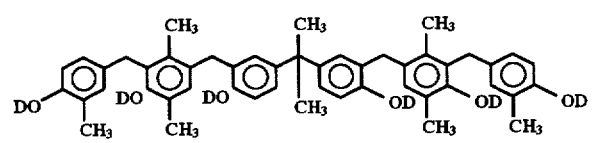 (211)
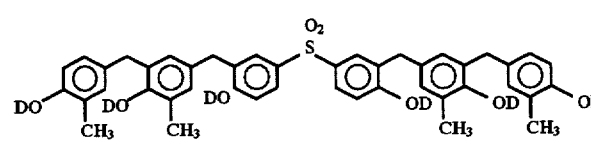 (212)
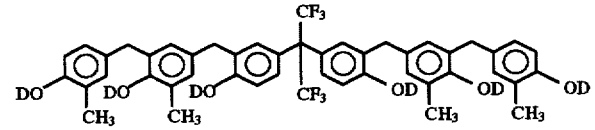 (213)
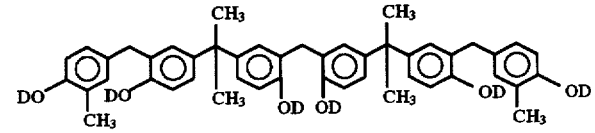 (214)
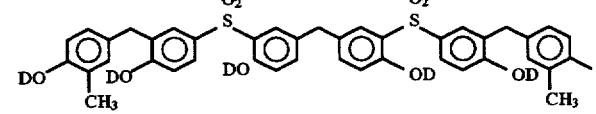 (215)
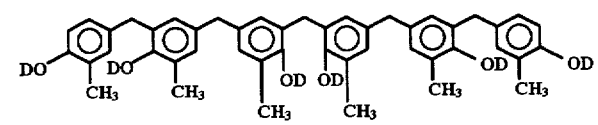 (216)
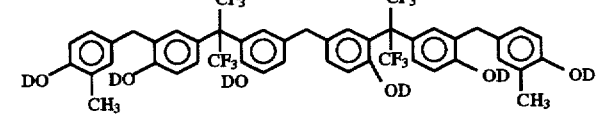 (217)
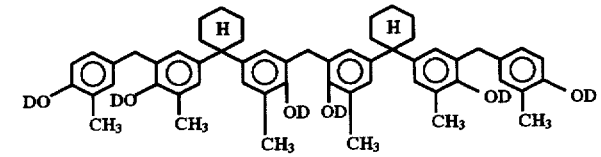 (218)
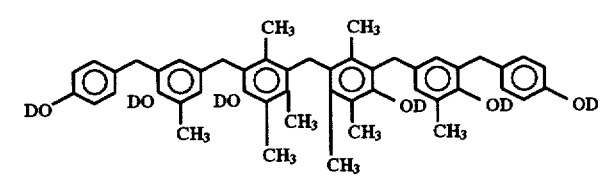 (219)

-continued
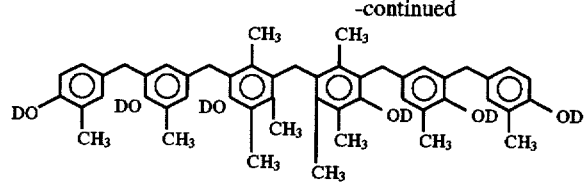 (220)
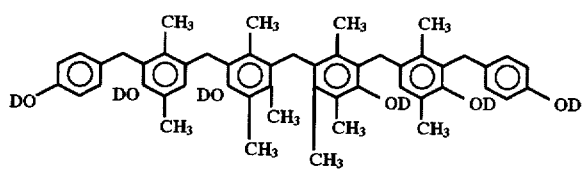 (221)
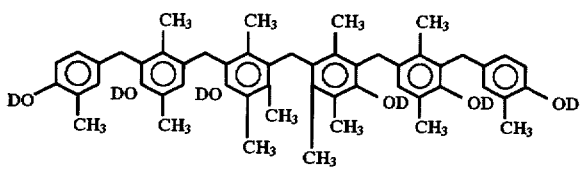 (222)
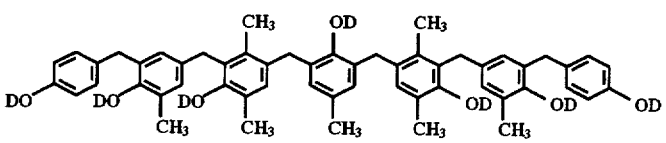 (223)
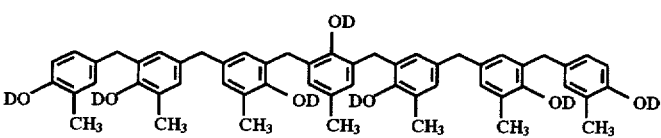 (224)
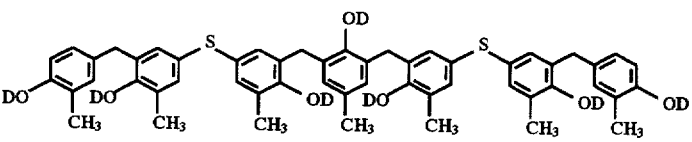 (225)
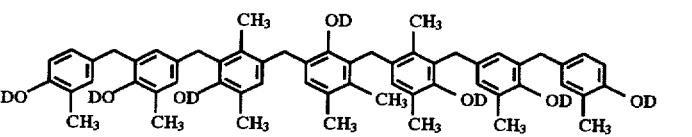 (226)
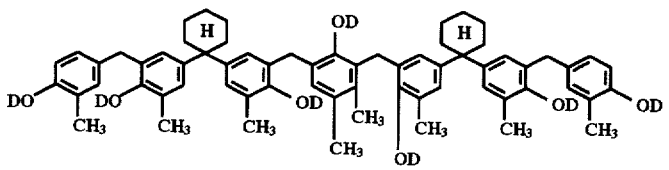 (227)
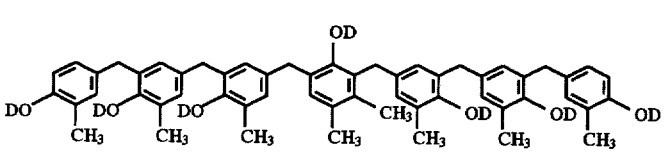 (228)
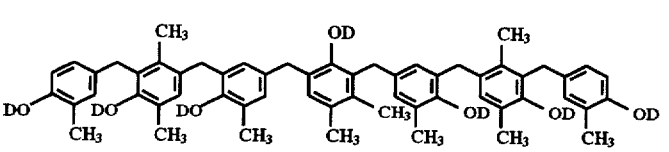 (229)

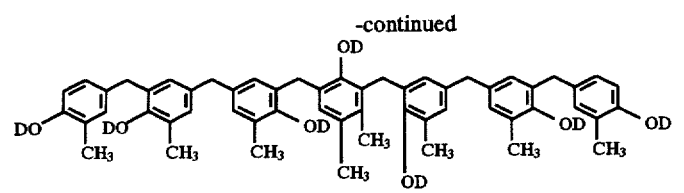
(230)
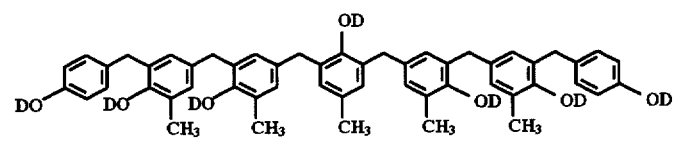
(231)
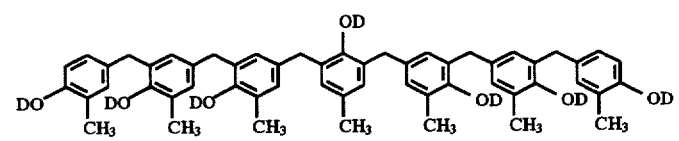
(232)
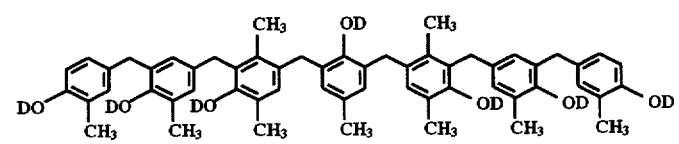
(233)
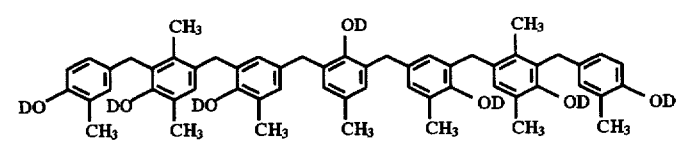
(234)
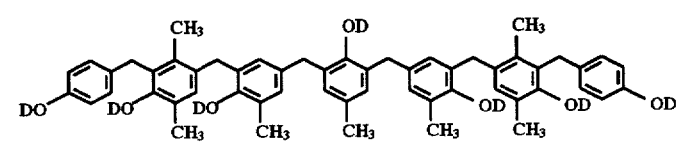
(235)
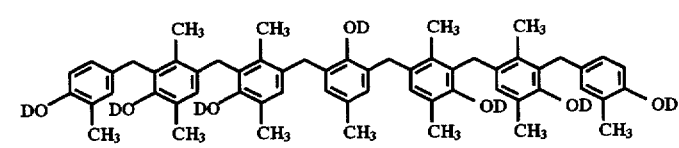
(236)
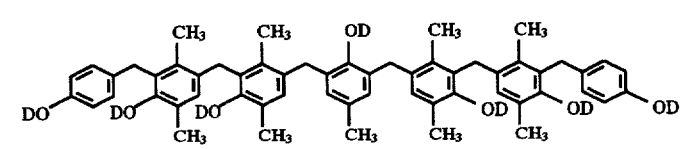
(237)
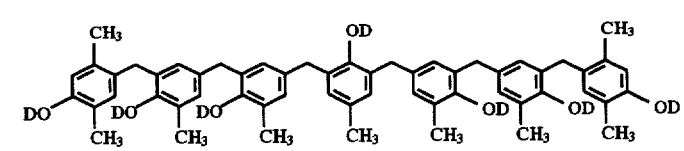
(238)
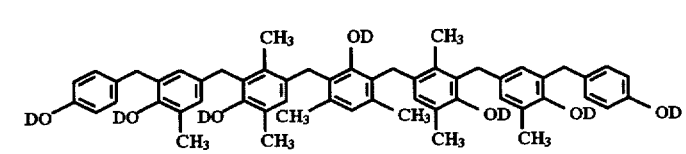
(239)
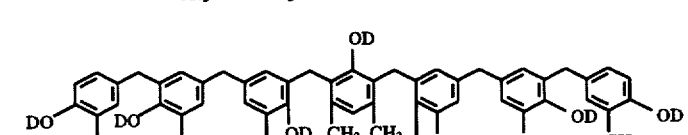
(240)

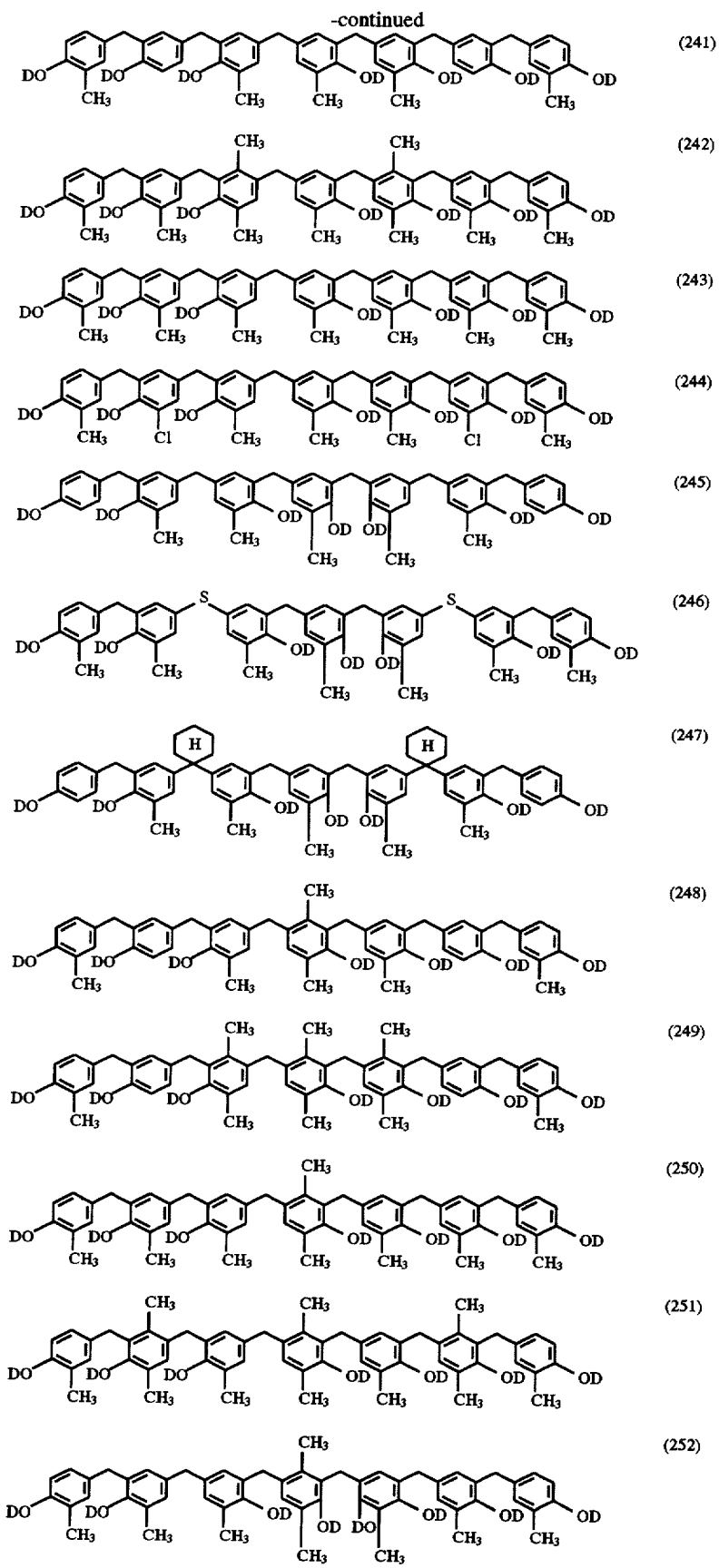

-continued

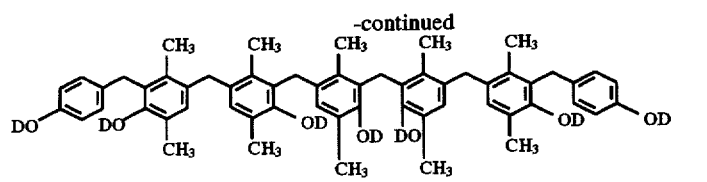 (253)

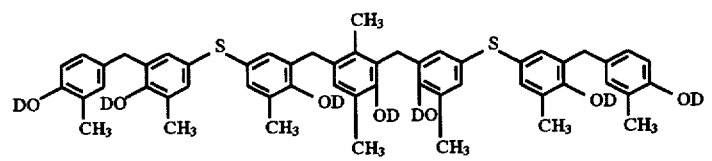 (254)

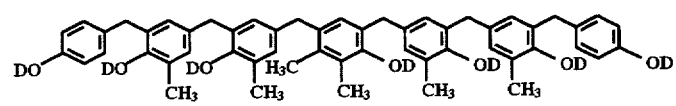 (255)

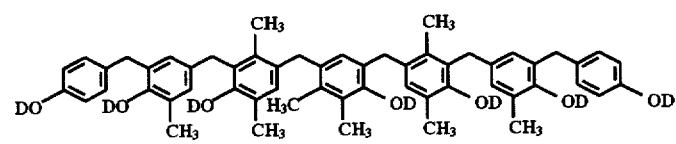 (256)

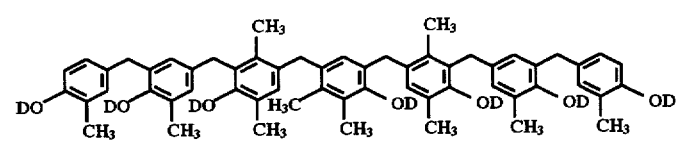 (257)

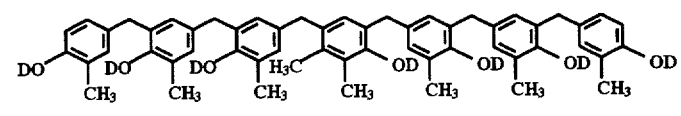 (258)

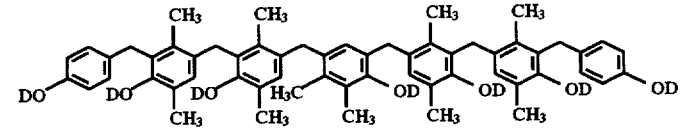 (259)

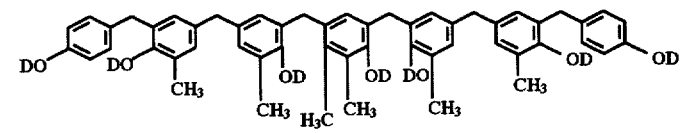 (260)

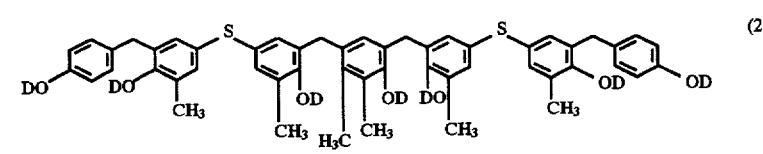 (261)

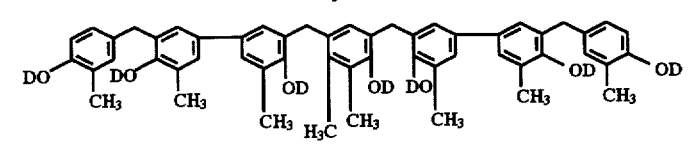 (262)

The ratio of the radiation ray sensitive compound (A) to the radiation ray sensitive compound (B) in their mixture constituting the radiation ray sensitive component to be in the photoresist composition of the present invention may be within the range from 0.02/1 to 20/1, preferably from 0.1/1 to 10/1, more preferably from 0.2/1 to 4/1. If the proportion of (A) in the mixture is too large, the film thickness dependence of the photoresist will increase, the resist residue after development will increase and the heat resistance of the resist film will lower. On the other hand, if the proportion of (B) in the mixture is too large, the latitude of the resist film for development will be narrow, the resolution of the resist film will lower, and the profiles of the resist patterns formed will be bad.

The mixture comprising the radiation ray sensitive compound (A) and the radiation ray sensitive compound (B) is preferably used in the present invention in the form of a composition containing it along with a particular, water-insoluble, alkali-soluble resin and a particular, water-insoluble, alkali-soluble low-molecular compound.

The particular, water-insoluble, alkali-soluble resin for use in the present invention is preferably a water-insoluble, alkali-soluble novolak resin having a ratio of its weight-average molecular weight to its number-average molecular weight of being from 1.2/1 to 5/1. Water-insoluble, alkali-soluble novolak resins having a ratio of the weight-average molecular weight to the number-average molecular weight of being less than 1.2/1 are difficult to industrially produce. On the other hand, if the ratio in question is more than 5/1, the latitude of the photoresist containing any such resin will be narrow and the resist residue after development will increase, unfavorably. Water-insoluble, alkali-soluble resins having such a small ratio of the weight-average molecular weight to the number-average molecular weight are easily produced by those skilled in the art, for example, referring to the disclosure of JP-A-4-122938, etc.

Above all, especially preferred are water-insoluble, alkali-soluble novolak resins to be produced by condensation of phenol, cresol, xylenol, trimethylphenol or a mixture of two or more of these, and an aldehyde compound, while having a weight-average molecular weight of from 5,500 to 25,000 and having a ratio of the weight-average molecular weight to the number-average molecular weight of being from 1.2/1 to 5/1; and water-insoluble, alkali-soluble novolak resins to be produced by condensation of a mixture of p-cresol, o-cresol, 2,3-xylenol, 2,6-xylenol and trimethylphenol, and an aldehyde compound, while having a weight-average molecular weight of from 1,500 to 5,000 and having a ratio of the weight-average molecular weight to the number-average molecular weight of being from 1.2/1 to 4.0/1. It is preferred that the photoresist composition of the present invention contains at least one of such water-insoluble, alkali-soluble novolak resins.

The data of the molecular weight of the above-mentioned novolak resins are obtained by GPC (gel permeation chromatography), using a standard polystyrene as the reference substance.

As the particular, water-insoluble, alkali-soluble low-molecular compound to be in the photoresist composition of the present invention, preferred are water-insoluble, alkali-soluble low-molecular compounds having 60 or less carbon atoms in total in one molecule and having from 2 to 10 phenolic hydroxyl groups in one molecule. More preferably, the water-insoluble, alkali-soluble low-molecular compounds are such that the ratio of the phenolic hydroxyl groups to the aromatic rings in one molecule is from 0.5/1 to 1.4/1, that the number of the carbon atoms in one molecule is from 12 to 50 in total, and that the compound contains from 2 to 10 phenolic hydroxyl groups in one molecule. It is preferred that the photoresist composition of the present invention contains at least one of such water-insoluble, alkali-soluble low-molecular compounds. Of such water-insoluble, alkali-soluble low-molecular compounds, especially preferred are those which may accelerate the solubility of water-insoluble, alkali-soluble resins in alkalies, when added to such alkali-soluble resins. When water-insoluble, alkali-soluble low-molecular compounds having more than 60 carbon atoms in total in one molecule are used, the effect of the present invention is lowered. On the other hand, when water-insoluble, alkali-soluble low-molecular compounds having less than 12 carbon atoms in total in one molecule are used, such cause other problems in that the heat resistance of the photoresist composition is lowered. In order to attain the effect of the present invention, the water-insoluble, alkali-soluble low-molecular compounds to be used must have at least two hydroxyl groups in one molecule. If, however, the number of the hydroxyl groups in one molecule is more than 10, the effect to broaden the latitude of the photoresist for development will be lost. If the ratio of the phenolic hydroxyl groups to the aromatic rings in the water-insoluble, alkali-soluble low-molecular compound to be in the photoresist composition is less than 0.5/1, the film thickness dependence of the photoresist will be large and the latitude of the photoresist for development will be narrow. If, however, the ratio in question is more than 1.4/1, the stability of the photoresist composition will be poor and, in addition, it is unfavorably difficult to obtain photoresists having a high resolution and low film thickness dependence.

The amount of the low-molecular compound to be added is preferably from 2 to 100% by weight, more preferably from 10 to 70% by weight, relative to the alkali-soluble resin. If it is more than 100% by weight, such will unfavorably cause other problems in that the resist residue after development will increase and that the patterns formed will be deformed during development.

Water-insoluble, alkali-soluble low-molecular compounds having aromatic hydroxyl groups, which are used in the present invention, may easily be produced by those skilled in the art, for example, referring to the disclosures of JP-A-4-122938, JP-A-2-28531, U.S. Pat. No. 4,916,210, European Patent 219,294, etc. Specific examples of water-insoluble, alkali-soluble low-molecular compounds having aromatic hydroxyl groups, which are preferably used in the present invention, are mentioned below, but these are not whatsoever limitative.

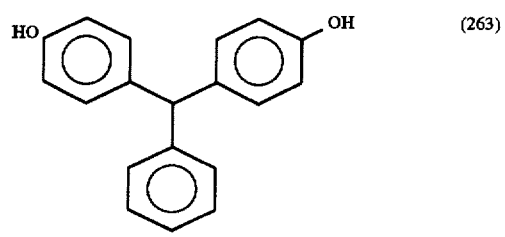

(263)

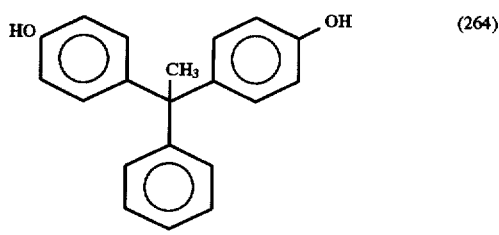

(264)

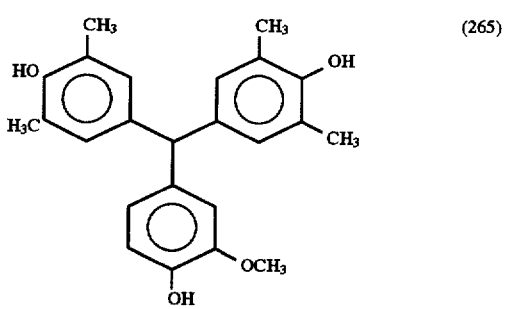

(265)

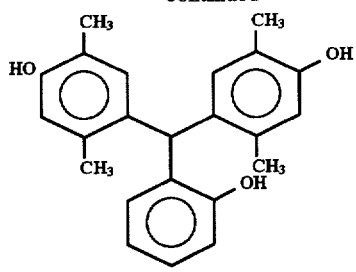
(266)
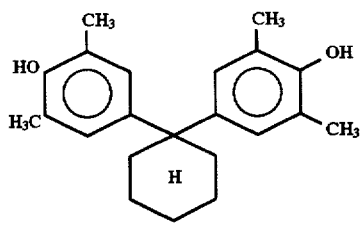
(272)
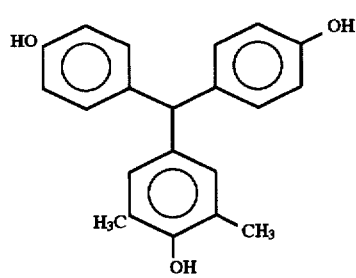
(267)
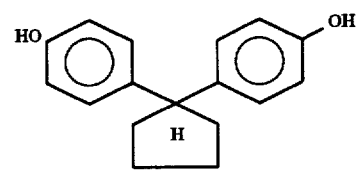
(273)
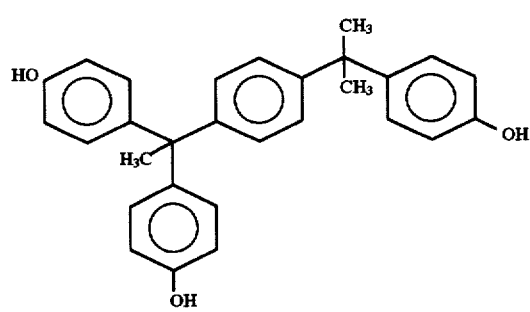
(268)
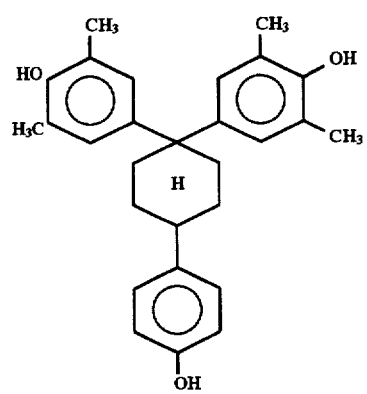
(274)
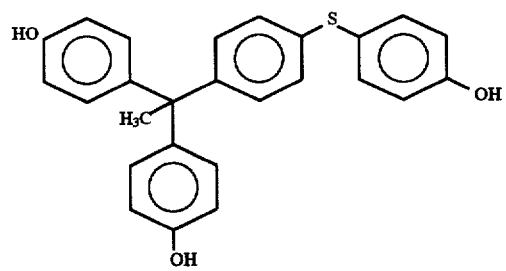
(269)
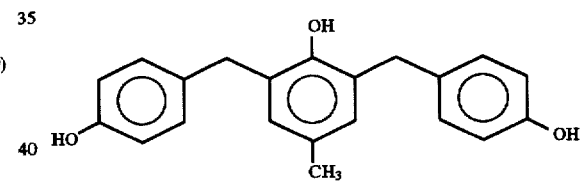
(275)
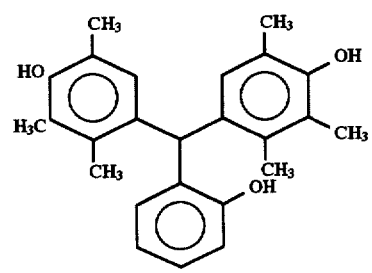
(270)
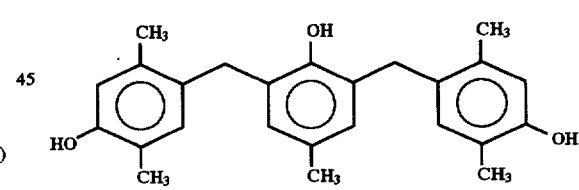
(276)
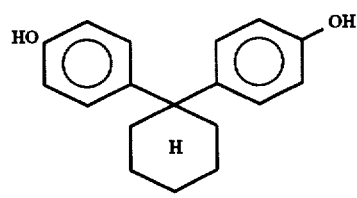
(271)
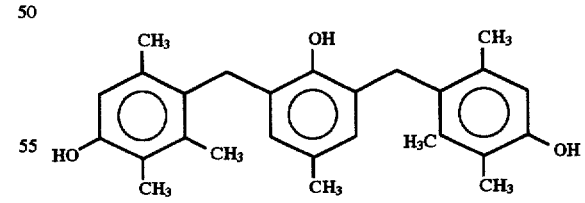
(277)
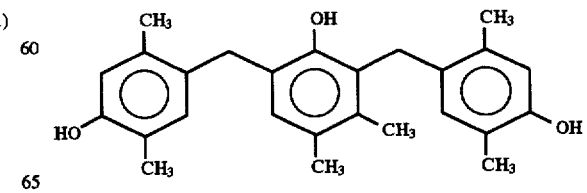
(278)

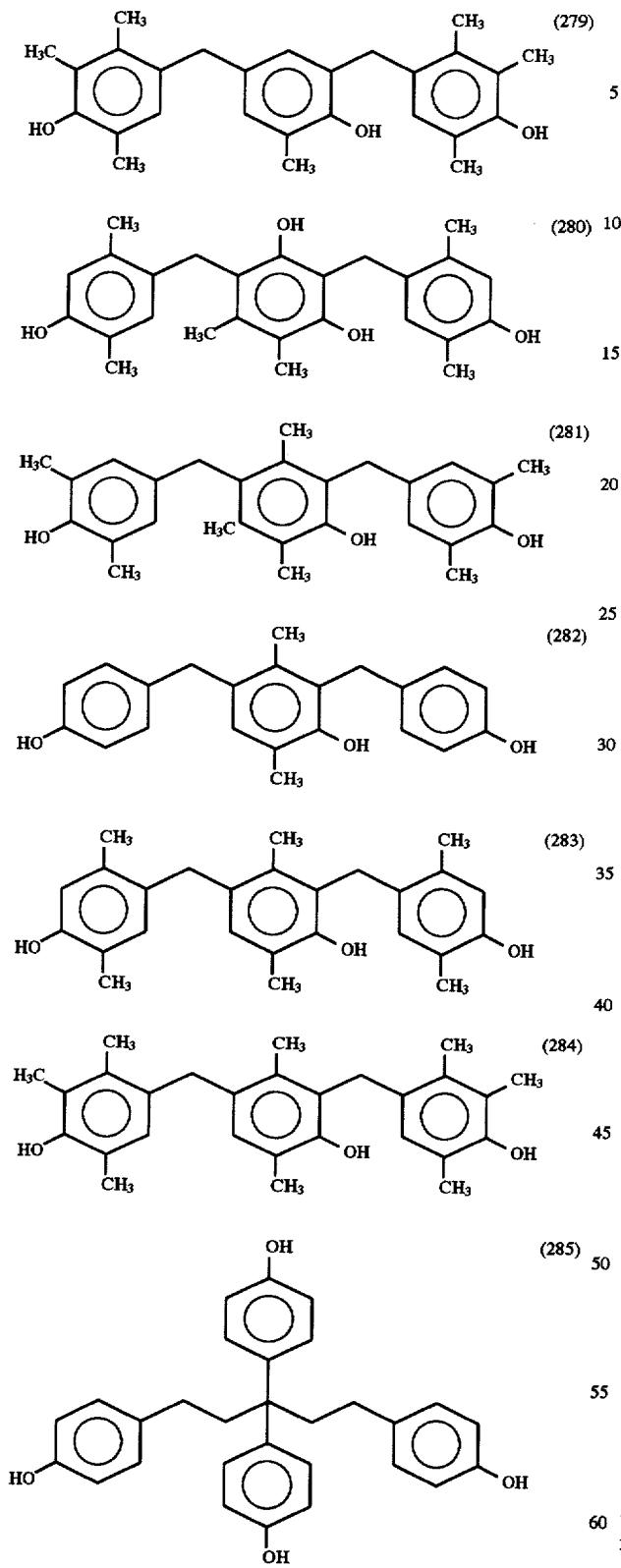

As the water-insoluble, alkali-soluble resins to be used in the present invention, preferred are novolak resins, vinylphenol resins, acetone-pyrogallol resins, acetone-resol resins, maleimide copolymers, N-(hydroxyphenyl) maleimide (co)polymers, styrene-maleic anhydride copolymers, polymers having carboxyl groups, sulfonyl groups, lactone groups or phosphonic acid groups, etc.

The water-insoluble, alkali-soluble novolak resins usable in the present invention may be obtained by condensing one mol of a substituted phenol or a mixture of substituted phenols and from 0.6 to 1.2 mols of aldehyde compound(s) in the presence of an acidic catalyst. Substituted phenols usable herein include, for example, phenol, p-cresol, m-cresol, o-cresol, 2,3-dimethylphenol, 2,4-dimethylphenol, 2,5-dimethylphenol, 2,6-dimethylphenol, 3,4-dimethylphenol, 3,5-dimethylphenol, 2,3,4-trimethylphenol, 2,3,5-trimethylphenol, 3,4,5-trimethylphenol, 2,4,5-trimethylphenol, methylene-bisphenol, methylene-bis-p-cresol, resorcinol, catechol, 2-methylresorcinol, 4-methylresorcinol, o-chlorophenol, m-chlorophenol, p-chlorophenol, 2,3-dichlorophenol, p-methoxyphenol, m-methoxyphenol, p-butoxyphenol, o-ethylphenol, m-ethylphenol, p-ethylphenol, 2,3-diethylphenol, 2,5-diethylphenol, p-isopropylphenol, p-tert-butylphenol, α-naphthol, β-naphthol, 4-phenylphenol, etc. These may be used singly or as a mixture of two or more of them. Of these, especially preferably used is a mixture of two or more of alkylphenols such as cresol, dimethylphenol, trimethylphenol, etc. In addition, monomethylolated or dimethylolated derivatives to be derived from the above-mentioned substituted phenols may also be used.

Aldehydes usable herein include, for example, formalin, paraformaldehyde, acetaldehyde, benzaldehyde, hydroxybenzaldehyde, glyoxal, chloroacetaldehyde, dichloroacetaldehyde, bromoacetaldehyde, acrolein, methaclorein, crotonaldehyde, acrolein-dimethylacetal, furfural, etc. These may be used singly or as a mixture of two or more of them.

The acidic catalyst to be used herein includes, for example, hydrochloric acid, sulfuric acid, nitric acid, formic acid, acetic acid, oxalic acid, p-toluenesulfonic acid, etc.

The water-insoluble, alkali-soluble resins for use in the present invention preferably have a mean molecular weight of from 1,000 to 25,000, more preferably from 2,000 to 15,000, in terms of Mw. Resins having a larger Mw value than that falling within the defined range are ineffective, since the photoresists containing them cannot have a broad latitude for development.

The radiation ray sensitive component to be in the photoresist composition of the present invention may contain, in addition to the mixture composed of the radiation ray sensitive compound (A) and the radiation ray sensitive compound (B), any other radiation ray sensitive compound (s). As additional radiation ray sensitive compounds to be in the component, mentioned are radiation ray sensitive, alkali-solubility inhibiting compounds, radiation ray sensitive, acid-generating compounds, etc. If the component contains a radiation ray sensitive, acid-generating compound, it is preferred that the compound is combined with an unstable acid group-containing, alkali-solubility inhibiting compound.

As radiation ray sensitive, alkali-solubility inhibiting compounds usable herein, for example, mentioned are quinonediazide compounds, diazoketone compounds, azide compounds, orthonitrobenzyl compounds, orthonitroarylsulfonyl ester compounds, polyolefine-sulfone compounds, etc.

As quinonediazide compounds usable herein, for example, mentioned are esters of 1,2-naphthoquinone-diazido-5-sulfonic acid, 1,2-naphthoquinone-diazido-4-sulfonic acid or 1,2-benzoquinonediazido-4-sulfonic acid and a polyhydroxy-aromatic compound.

Examples of said polyhydroxy-aromatic compound include polyhydroxybenzophenones such as 2,3,4-trihydroxybenzophenone, 2,4,4'-trihydroxybenzophenone, 2,4,6-trihydroxybenzophenone, 2,3,4,4'-tetrahydroxybenzophenone, 2,2',4,4'-tetrahydroxybenzophenone, 2,4,6,3',4',5'-hexahydroxybenzophenone, 2,3,4,3',4',5'-hexahydroxybenzophenone, etc.; polyhydroxyphenyl alkyl ketones such as 2,3,4-trihydroxyacetophenone, 2,3,4-trihydroxyphenyl hexyl ketone, etc.; bis((poly) hydroxyphenyl)alkanes such as bis(2,4-dihydroxyphenyl) methane, bis(2,3,4-trihydroxyphenyl)methane, bis(2,4-dihydroxyphenyl)propane-1, etc.; polyhydroxybenzoates such as propyl 3,4,5-trihydroxybenzoate, phenyl 3,4,5-trihydroxybenzoate, etc.; bis(polyhydroxybenzoyl)alkanes and bis(polyhydroxybenzoyl)aryls such as bis(2,3,4-trihydroxybenzoyl)methane, bis(2,3,4-trihydroxybenzoyl) benzene, etc.; alkylene-di(polyhydroxybenzoates) such as ethylene glycol-di(3,5-dihydroxybenzoate), etc.; polyhydroxy-biphenyls such as 3,5,3',5'-biphenyltetrol, 2,4,2',4'-biphenyltetrol, 2,4,6,3',5'-biphenylpentol, 2,4,6,2',4',6'-biphenylhexol, etc.; polyhydroxy-triphenylmethanes such as 4,4',3",4"-tetrahydroxy-3,5,3',5'-tetramethyltriphenylmethane, 4,4',2",3",4"-pentahydroxy-3,5,3',5'-tetramethyltriphenylmethane, 2,3,4,2',3',4',3",4"-octahydroxy-5,5'-diacetyltriphenylmethane, etc.; polyhydroxyspirobi-indanes such as 3,3,3',3'-tetramethyl-1,1'-spirobi-indane-5,6,5',6'-tetrol, 3,3,3',3'-tetramethyl-1,1'-spirobi-indance-5,6,7,5',6',7'-hexol, 3,3,3',3'-tetramethyl-1,1'-spirobi-indane-4,5,6,4',5',6'-hexol, 3,3,3',3'-tetramethyl-1,1'-spirobi-indane-4,5,6,5',6',7'-hexol, etc.; polyhydroxyphthalides such as 3,3-bis(3,4-dihydroxyphenyl)phthalide, 3,3-bis(2,3,4-trihydroxyphenyl)phthalide, 3',4',5',6'-tetrahydroxyspiro [phthalido-3,9'-xanthene], etc.; polyhydroxybenzopyrans such as 2-(3,4-dihydroxyphenyl)-3,5,7-trihydroxybenzopyran, 2-(3,4,5-trihydroxyphenyl)-3,5,7-trihydroxybenzopyran, 2-(3,4-dihydroxyphenyl)-3-(3,4,5-trihydroxybenzoyloxy)-5,7-dihydroxybenzopyran, 2-(3,4,5-trihydroxyphenyl)-3-(3,4,5-trihydroxybenzoyloxy)-5,7-dihydroxybenzopyran, etc.; polyhydroxyphenylchromans such as 2,4,4-trimethyl-2-(2',4'-dihydroxyphenyl)-7-hydroxychroman, 2,4,4-trimethyl-2-(2',3',4'-trihydroxyphenyl)-7,8-dihydroxychroman, 2,4,4-trimethyl-2-(2',4',6'-trihydroxyphenyl)-5,7-dihydroxychroman, etc.; hydroxybenzylphenols such as 2,6-bis(2,3,4-trihydroxybenzyl)-4-methylphenol, 2,6-bis(2,4-dihydroxybenzyl)-4-methylphenol, 2,6-bis(5-chloro-2,4-dihydroxybenzyl)-4-methylphenol, 2,6-bis(2,4,6-trihydroxybenzyl)-4-methylphenol, 2,6-bis(2-acetyl-3,4,5-trihydroxybenzyl)-4-methylphenol, 2,4,6-tris(2,3,4-trihydroxybenzyl)phenol, 2,6-bis(3,5-dimethyl-4-hydroxybenzyl)-4-methylphenol, 2,4,6-tris(3,5-dimethyl-4-hydroxybenzyl)-4-methylphenol, 4,6-bis(3,5-dimethyl-4-hydroxybenzyl)pyrogallol, 2,6-bis(3,5-dimethyl-4-hydroxybenzyl)-4-methylphenol, 2,6-bis(3,5-dimethyl-4-hydroxybenzyl)phloroglucinol, etc.; flavono dyes such as quercetin, rutin, etc.; low-nuclear compounds such as novolaks and their analogues, etc.

Polymers having aromatic hydroxyl groups, such as acetone-pyrogallol condensate resins, polyvinyl phenols, etc., may be used in place of these low-molecular compounds. In addition, suitable amounts of hydroxyl groups themselves in these novolaks may be substituted by quinonediazido groups to give photosensitive materials usable in the present invention. These photosensitive materials act also as binders.

Of the above-mentioned polyhydroxy-aromatic compounds, especially preferred are those which have a moiety having two or more around the same aromatic in one and the same aromatic ring and have three or more hydroxyl groups in total in one molecule.

As diazoketone compounds usable herein, for example, mentioned are 5-diazo-Meldrum's acid, 2-diazo-1-phenylbutane-1,3-dione, 1,3-diphenyl-2-diazoporpane-1,3-dione, 2-diazomethylphenyl malonate, 2-diazo-1-(3'-chlorosulfonylphenyl)-1-trimethylsilylpropane-1,3-dione, as well as diazoketone compounds described in JP-A-60-14235, JP-A-62-47296, JP-A-63-253938, JP-A-63-253940, etc.

As azide compounds usable herein, for example, mentioned are monoazide compounds such as 1-azidopyrene, p-azidobenzophenone, 4'-methoxy-4-azidodiphenylamine, 4-azidobenzal-2'-methoxyacetophenone, 4-azido-4'-nitrophenylazobenzene, 1-(p-azidophenyl)-1-cyano-4-(p-diethylaminophenyl)-1,3-butadiene, 4-azidochalcone, etc.; and diazide compounds such as 4,4'-diazidobenzophenone, 4,4'-diazidodiphenylmethane, 4,4'-diazidostilbene, 4,4'-diazidochalcone, 4,4'-diazidobenzalacetone, 4,4'-diazidodiphenyl ether, 4,4'-diazidodiphenylsulfide, 4,4'-diazidodiphenylsulfone, 2,6-di(4'-azidobenzal) cyclohexanone, 2,6-di(4'-azidobenzal)-4-methylcyclohexanone, 1,8-diazidonaphthalene, 3-azido-4'-(3'-azidobenzalmethyl)stilbene; and azide compounds described in JP-B-35-49295, JP-B-48-31841, JP-B-44-26047, JP-B-44-26048, JP-B-45-7328, JP-B-47-30204, JP-B-49-12283, JP-B-51-29932, JP-B-53-325, JP-A-48-14316, JP-A-48-93623, JP-A-49-81103, JP-A-55-57538, JP-A-56-39598, JP-A-58-68036, JP-A-58-203438, JP-A-60-107644, JP-A-62-2249, JP-A-63-305347, U.S. Pat. Nos. 2,852,379, 2,940,853, 3,092,494, British Patent 892,811, French Patent 1,511,485, German Patent 514,057, etc.

As orthonitrobenzyl compounds usable herein, for example, mentioned are orthonitrobenzyl stearate, orthonitrobenzyl cholesterate, orthonitrobenzyloxytriphenylsilane, 5-methyl-2-nitrobenzyltriphenylsilane, di(5-chloro-2-nitrobenzyloxy)diphenylsilane, poly-orthonitrobenzyl methacrylate, poly-orthonitrobenzyl acrylate, orthonitrobenzaldehyde-acetalized polyvinyl alcohol, and orthonitrobenzyl compounds described in JP-A 48-47320, JP-A-60-198538, JP-A-61-138255, JP-A-62-153853, JP-B-56-2696, etc.

As orthonitroarylsulfenyl ester compounds usable herein, for example, mentioned are 2,4-dinitrobenzenesulfenyl cholate, orthonitrobenzenesulfenyladamantane-carboxylate, orthonitrobenzenesulfenyltris(trimethylsilyl) cholate, poly-2,4-dinitrobenzenesulfenyl methacrylate, and orthonitroarylsulfenyl ester compounds described in JP-A-61-3141, JP-A-61-36741, etc.

As polyolefinsulfone compounds usable herein, for example, mentioned are polybutene-1-sulfone, polyhexene-1-sulfone, polycyclopentenesulfone, poly-2-methylpentenesulfone, polyoctene-1-sulfone, polubutene-2-sulfone, and polyolefinesulfone compounds described in JP-A-62-27732, JP-A-63-218949, etc.

As radiation ray sensitive, acid-generating compounds usable herein, for example, mentioned are compounds generating acids by light exposure as described in JP-A-59-45439, JP-A-60-3625, JP-A-62-229242, JP-A-63-27829, JP-A-63-36240, JP-A-63-250642, *Polym. Eng. Sce.*, Vol. 23, p. 1012 (1983), *ACS. Sym.*, Vol. 242, p. 11 (1984), *Semiconductor World*, November, 1987, p. 91, *Macromolecules*, Vol. 21, p. 1475 (1988), and *SPIE*, Vol. 920, p. 42 (1988), etc.

As unstable acid group-containing, alkali-solubility inhibiting compounds usable herein, for example, mentioned are acetal or O, N-acetal compounds as described in JP-A-48-89003, orthoester or amideacetal compounds as described in JP-A-51-120714, polymers having acetal or ketal main chains as described in JP-A-53-133429, enol ether compounds as described in JP-A-55-12995, N-acylamino carbonic acid compounds as described in JP-A-55-126236, polymers having orthoester main chains as described in JP-A-56-17345, tertiary or secondary alkyl ester compounds as described in JP-A-59-45439, JP-A-60-3625, JP-A-62-229242, JP-A-63-27829, JP-A-63-36240, JP-A-63-250642 and Japanese patent application No. 6-63862, silyl ether compounds as described in JP-A-60-37549 and JP-A-60-121446, and tetrahydropyranyl ether compounds.

As tetrahydropyranyl ether compounds usable herein, for example, mentioned are 4,4'-isopropylidenediphenol-bis-2-tetrahydropyranyl ether, 4,4'-sulfonyldiphenol-bis-tetrahydropyranyl ether, poly-tetrahydropyranyl ethers of phenol-formaldehyde resins, and tetrahydropyranyl ether compounds described in U.S. Pat. No. 3,779,778, etc.

The content of the mixture composed of the radiation ray sensitive compound (A) and the radiation ray sensitive compound (B) in the radiation ray sensitive component to be in the photoresist composition of the present invention shall be 30% or more, preferably 40% or more, especially preferably 50% or more, of the radiation ray sensitive component. If the content is less than 30%, the film thickness dependence of the photoresist will be large and the resist residue after development will also be large.

Regarding the content of the radiation ray sensitive component and that of the water-insoluble, alkali-soluble resin in the photoresist composition of the present invention, the former component is from 5 to 100 parts by weight, preferably from 20 to 80 parts by weight, relative to 100 parts by weight of the latter resin. If the content of the radiation ray sensitive component is less than 5 parts by weight, the composition will form an extremely insufficient photoresist film. If, however, it is more than 100 parts by weight, the sensitivity of the photoresist composition will be low and the solubility of the composition in solvent will also be low.

When the photoresist composition of the present invention contains a radiation ray sensitive, acid-generating compound, the content of the compound may be from 0.1 to 200 parts by weight, preferably from 1 to 60 parts by weight, relative to 100 parts by weight of the unstable acid group-containing, alkali-dissolution inhibiting compound to be combined with the acid-generating compound. If the content in question is less than 0.1 part by weight, the sensitivity of the photoresist composition will be extremely low.

The photoresist composition of the present invention may additionally contain a polyhydroxy compound so as to have an accelerated solubility in developers. As preferred polyhydroxy compounds usable for this purpose, mentioned are polyhydroxy-aromatic compounds which are the ester residues of the above-mentioned quinonediazide compounds. Typical examples of such compounds include phenols, resorcinol, phloroglucinol, 2,3,4-trihydroxybenzophenone, 2,3,4,4'-tetrahydroxybenzophenone, pentahydroxybenzophenone, hexahydroxybenzophenone, polyhydroxytriphenylmethanes, polyhydroxyspiroindanes, hydroxybenzylphenols, acetone-pyrogallol condensate resins, phloroglucide, etc.

As solvents to dissolve the radiation ray sensitive components, the water-insoluble, alkali-soluble low-molecular compounds and the water-insoluble, alkali-soluble resins, to form the photoresist compositions of the present invention, usable are ketones such as methyl ethyl ketone, methyl amyl ketone, cyclohexanone, etc.; alcohol ethers such as ethylene glycol monomethyl ether, ethylene glycol monoethyl ether, diethylene glycol monomethyl ether, diethylene glycol monoethyl ether, etc.; alcohols such as n-propyl alcohol, iso-butyl alcohol, n-butyl alcohol, cyclohexyl alcohol, diacetone alcohol, etc.; ethers such as dioxane, ethylene glycol dimethyl ether, diethylene glycol dimethyl ether, etc.; esters such as methyl cellosolve acetate, ethyl cellosolve acetate, methyl methoxypropionate, propyl formate, propyl acetate, butyl acetate, methyl propionate, methyl lactate, ethyl lactate, ethyl 2-hydroxy-2-methylpropionate, methoxyethyl propionate, methoxymethyl propionate, ethoxyethyl propionate, ethyl pyruvate, etc.; propylene glycols such as propylene glycol, propylene glycol monomethyl ether, propylene glycol monoethyl ether, propylene glycol monomethyl ether acetate, etc.; halogenohydrocarbons such as 1,1,2-trichloroethylene, etc.; aromatic hydrocarbons such as toluene, xylene, etc.; and high-polar solvents such as dimethylacetamide, N-methylpyrrolidone, dimethylformamide, dimethylsulfoxide, etc. These solvents may be used singly or as a mixed solvent comprising two or more of them.

The radiation ray sensitive resin composition of the present invention may contain, if desired, various compatible additives, such as dye, plasticizer, adhesive aid, preservative, stabilizer, sensitizer, striation inhibitor, surfactant, etc. Examples of such additives include dyes, such as methyl violet, crystal violet, malachite green, curcumin, tinubin, thiazolylazophenol, etc.; plasticizers such as stearic acid, acetal resins, phenoxy resins, alkyd resins, etc.; adhesive aids such as hexamethyldisilazane , chloromethylsilane, etc.; polyoxyethylene ethers such as polyoxyethylene lauryl ether, polyoxyethylene oleyl ether, polyoxyethylene nonylphenyl ether, etc.; polyoxyethylene-polyoxypropylene block copolymers; sorbitan fatty acid esters such as sorbitan monostearate, sorbitan trioleate, etc.; polyoxyethylene sorbitan fatty acid esters such as polyoxyethylene sorbitan monostearate, polyoxyethylene sorbitan monopalmitate, polyoxyethylene sorbitan trioleate, etc.; fluorine-containing surfactants such as Eftop EF301, EF303, EF352 (all made by Shin-Akita Chemical Co.), Megafac F171, F173 (both made by Dainippon Ink & Chemicals, Inc.), Florad FC430, FC431 (both made by Sumitomo 3M's Co.), Asahiguard AG710, Surflon S-382, SC101, SC102, SC103, SC106 (all made by Asahi Glass Co.), etc.; surfactants such as organosiloxane polymer KP341 (made by Shin-etsu Chemical Industry Co.), acrylic acid or methacrylic acid (co)polymer No. 75, No. 79 (both made by Kyouei-sha Oils & Fats Chemical Industry Co.), etc. The content of said additives in the composition of the present invention may be generally 2 parts by weight or less, preferably 1 part by weight or less, relative to 100 parts by weight of the water-insoluble, alkali-soluble resin therein.

As the dyes which may be incorporated into the composition of the present invention, especially preferred are dyes containing alkali-soluble groups, such as aromatic hydroxyl groups, carboxylic acid groups, etc., in the molecule, for example, curcumin, etc. When these are added to the composition of the present invention, it is desired that the amount of the low-molecular dissolution accelerator in the composition is suitably adjusted in accordance with the dyes added, by which the properties of the composition may be optimized.

The above-mentioned radiation ray sensitive resin composition of the present invention is coated on substrates, such as those to be used in production of precision integrated circuit devices (e.g., silicon dioxide-coated silicon substrate), by means of suitable coating methods using a spinner, a coater, etc., then exposed through a predetermined mask and developed to give good resist patterns.

The radiation ray sensitive resin composition of the present invention generally gives so-called positive type pattern images composed of the parts of the composition not exposed to ionizing radiation. However, if the coated photoresist of the present invention is heat-treated in an amine atmosphere, for example, by the method described in JP-A-63-316429, or if any of additional compounds of 2,6-di-t-butylpyridine, benzimidazole, pyridine, quinoline, acridine, lutidine, 1-methylbenzimidazole, melamine-formaldehyde alkyl ethers, etc., such as those described in JP-A-62-35350 and European Patent 263,434A, is added to the resin composition of the present invention, negative patterns may be effectively obtained by so-called image reversal.

As the developer to develop the photoresist composition of the present invention, usable are aqueous solutions of alkalies, for example, inorganic alkalies such as sodium hydroxide, potassium hydroxide, sodium carbonate, sodium silicate, sodium metasilicate, aqueous ammonia, etc.; primary amines such as ethylamine, n-propylamine, etc.; secondary amines such as diethylamine, di-n-butylamine, etc.; tertiary amines such as triethylamine, methyldiethylamine, etc.; alcoholamines such as dimethylethanolamine, triethanolamine, etc.; quaternary ammonium salts such as tetramethylammonium hydroxide, tetraethylammonium hydroxide, choline hydroxide, etc.; cyclic amines such as pyrrole, piperidine, etc. These aqueous alkali solutions may contain, if desired, suitable amounts of alcohols, surfactants, aromatic hydroxyl group-containing compounds, etc. Of these, especially preferred is tetramethylammonium hydroxide.

The present invention will be explained in more detail by means of the following examples, which, however, are not intended to restrict the scope of the present invention.

PRODUCTION EXAMPLE 1

Production of Radiation ray sensitive Compound (2A):

50.5 g of 2,6-bis(hydroxymethyl)-p-cresol and 194.7 g of o-cresol were dissolved in 200 ml of methanol, in a three-neck flask equipped with a stirrer, a reflux condenser and a thermometer, and 9.1 g of 36% hydrochloric acid were added thereto. These were then reacted for 7 hours, while being heated under reflux. The reaction mixture was put into 4 liters of water, and the precipitate formed was washed with water. This was stirred in hexane/dichloromethane (2/1) to remove the non-reacted, raw materials therefrom. This was then recrystallized from ethanol/water to obtain 54 g of a white solid. By NMR, this was identified to be 2,6-bis(3'-methyl-4'-hydroxybenzyl)-p-cresol.

8.71 g of the thus-obtained 2,6-bis(3'-methyl-4'-hydroxybenzyl)-p-cresol, 13.43 g of 1,2-naphthoquinonediazido-5-sulfonyl chloride, 200 ml of acetone and 10 ml of distilled water were put into a four-neck flask equipped with a stirrer, a reflux condenser, a thermometer and a dropping device, and these were dissolved therein. To this, dropwise added were 25 ml of acetone solution containing 5.27 g of triethylamine at room temperature over a period of 35 minutes, and these were reacted for further 3 hours. 3.14 g of acetic acid were added to the reaction mixture, which was then poured into 3 liters of distilled water. The yellow precipitate thus formed was taken out by filtration, washed with water and dried to obtain 19.7 g of radiation ray sensitive compound (2A). Analysis of the compound by high performance liquid chromatography revealed it to comprise 59% of diester and 24% of triester.

PRODUCTION EXAMPLE 2

Production of Radiation ray sensitive Compound (2B):

The same process as in Production Example 1 was repeated, except that 5.81 g of 2,6-bis(3'-methyl-4'-hydroxybenzyl)-p-cresol were used in place of 8.71 g of 2,6-bis(3'-methyl-4'-hydroxybenzyl)-p-cresol, to obtain 17.1 g of radiation ray sensitive compound (2B). Analysis of the compound by high performance liquid chromatography revealed it to comprise 20% of diester and 75% of triester.

PRODUCTION EXAMPLE 3

Production of Radiation ray sensitive Compound (3A):

40.4 g of 2,6-bis(hydroxymethyl)-p-cresol and 176 g of 2,5-xylenol were dissolved in 170 ml of methanol, in a three-neck flask equipped with a stirrer, a reflux condenser and a thermometer, and 7.3 g of 36% hydrochloric acid were added thereto. These were then reacted for 12 hours, while being heated under reflux. The reaction mixture was put into 3.5 liters of water, and the precipitate formed was washed with water. This was stirred in hexane/dichloromethane (2/1) to remove the non-reacted, raw materials therefrom. This was then recrystallized from ethanol/water to obtain 41 g of a white solid. By NMR, this was identified to be 2,6-bis(2',5'-dimethyl-4'-hydroxybenzyl)-p-cresol.

7.34 g of the thus-obtained 2,6-bis(2',5'-dimethyl-4'-hydroxybenzyl)-p-cresol, 10.48 g of 1,2-naphthoquinonediazido-5-sulfonyl chloride, 160 ml of acetone and 10 ml of distilled water were put into a four-neck flask equipped with a stirrer, a reflux condenser, a thermometer and a dropping device, and these were dissolved therein. To this, dropwise added were 20 ml of acetone solution containing 4.11 g of triethylamine at room temperature over a period of 30 minutes, and these were reacted for further 5 hours. 2.45 g of acetic acid were added to the reaction mixture, which was then poured into 2.5 liter of distilled water. The yellow precipitate thus formed was taken out by filtration, washed with water and dried to obtain 15.5 g of radiation ray sensitive compound (3A). Analysis of the compound by high performance liquid chromatography revealed it to comprise 61% of diester and 35% of triester.

PRODUCTION EXAMPLE 4

Production of Radiation ray sensitive Compound (3B):

The same process as in Production Example 3 was repeated, except that 4.91 g of 2,6-bis(2',5'-dimethyl-4'-hydroxybenzyl)-p-cresol were used in place of 7.34 g of 2,6-bis(2',5'-dimethyl-4'-hydroxybenzyl)-p-cresol, to obtain 13.2 g of radiation ray sensitive compound (3B). Analysis of the compound by high performance liquid chromatography revealed it to comprise 18% of diester and 77% of triester.

PRODUCTION EXAMPLE 5

Production of Radiation ray sensitive Compound (71A):

116 g of phenol and 2.5 g of aqueous 16% solution of methylmercaptan sodium salt were put into a flask equipped with a stirrer, a reflux condenser, a thermometer, a dropping device and a gas-introducing duct, and hydrogen chloride gas was introduced thereinto until saturation, while stirring at 40° C. While further introducing hydrogen chloride gas into the flask at 40° C., a mixture comprising 19 g of p-isopropenyl acetophenone and 19 g of phenol was dropwise added thereto over a period of 2 hours. These were reacted at 40° C. for 6 hours, while further introducing hydrogen chloride gas little by little thereinto. After cooled to room temperature, the reaction mixture was allowed to stand at room temperature overnight. Then, 700 g of toluene and 360 g of aqueous 3% solution of sodium hydrogencarbonate were added thereto and vigorously stirred at 80° C. for 30 minutes. After cooled to room temperature, the crystals thus formed and precipitated were taken out by filtration and washed with toluene and distilled water. These were dissolved under heat in a mixed solvent comprising methyl isobutyl ketone and toluene, washed with distilled water and cooled. The crystals were taken out by filtration and dried to obtain 41 g of white crystals having a melting point of 221 to 224° C. Mass spectrometry of the product revealed $M^+=424$.

16.99 g of the thus-obtained white crystals, 21.49 g of 1,2-naphthoquinonediazido-5-sulfonyl chloride, 320 ml of acetone and 15 ml of distilled water were put into a four-neck flask equipped with a stirrer, a reflux condenser, a thermometer and a dropping device, and these were dissolved therein. To this, dropwise added were 40 ml of acetone solution containing 8.43 g of triethylamine at room temperature over a period of 30 minutes, and these were reacted for further 4 hours. 5.02 g of acetic acid were added to the reaction mixture, which was then poured into 4.8 liter of distilled water. The yellow precipitate thus formed was taken out by filtration, washed with water and dried to obtain 32.7 g of radiation ray sensitive compound (71A). Analysis of the compound by high performance liquid chromatography revealed it to comprise 68% of diester and 29% of triester.

PRODUCTION EXAMPLE 6

Production of Radiation ray sensitive Compound (71B):

The same process as in Production Example 5 was repeated, except that 11.33 g of the white crystals were used in place of 16.99 g of them, to obtain 26.4 g of radiation ray sensitive compound (71B). Analysis of the compound by high performance liquid chromatography revealed it to comprise 10% of diester and 87% of triester.

PRODUCTION EXAMPLE 7

Production of Radiation ray sensitive Compound (9A):

15 g of 2,6-bis(3,5-dimethyl-4-hydroxybenzyl)-p-cresol, cresol, 30.3 g of 1,2-naphthoquinonediazido-5-sulfonyl chloride and 300 ml of acetone were put into a three-neck flask and dissolved uniformly. Next, a mixture of triethylamine/acetone (=12.4 g/30 ml) was gradually and dropwise added thereto and reacted at 25° C. for 15 hours. The reaction mixture was poured into 1500 ml of aqueous 1% solution of hydrochloric acid, and the precipitate formed was taken out by filtration, washed with water and methanol and dried at 40° C. to obtain radiation ray sensitive compound (9A). Analysis of the product by HPLC revealed it to be a mixture comprising 28% of triester and 59% of diester and containing other low-substituted substances as the balance.

PRODUCTION EXAMPLE 8

Production of Radiation ray sensitive Compound (9B):

10 g of 2,6-bis(3,5-dimethyl-4-hydroxybenzyl)-p-cresol, 30.3 g of 1,2-naphthoquinonediazido-5-sulfonyl chloride and 300 ml of acetone were put into a three-neck flask and dissolved uniformly. Next, a mixture of triethylamine/acetone (=12.4 g/30 ml) was gradually and dropwise added thereto and reacted at 25° C. for 15 hours. The reaction mixture was poured into 1500 ml of aqueous 1% solution of hydrochloric acid, and the precipitate formed was taken out by filtration, washed with water and methanol and dried at 40° C. to obtain radiation ray sensitive compound (9B). Analysis of the product by HPLC revealed it to be a mixture comprising 78% of triester and 12% of diester and containing other low-substituted substances as the balance.

PRODUCTION EXAMPLE 9

Production of Radiation ray sensitive Compound (139A):

50.5 g of 2,6-bis(hydroxymethyl)-p-cresol and 194.7 g of o-cresol were dissolved in 200 ml of methanol, in a three-neck flask equipped with a stirrer, a reflux condenser and a thermometer, and 9.1 g of 36% hydrochloric acid were added thereto. These were then reacted for 7 hours, while being heated under reflux. The reaction mixture was put into 4 liters of water, and the precipitate formed was washed with water. This was stirred in hexane/dichloromethane (2/1) to remove the non-reacted, raw materials therefrom. This was then recrystallized from ethanol/water to obtain 54 g of a white solid. By NMR, this was identified to be 2,6-bis(3'-methyl-4'-hydroxybenzyl)-p-cresol.

34.9 g of the thus-obtained 2,6-bis(3'-methyl-4'-hydroxybenzyl)-p-cresol, and 5.7 g of potassium hydroxide were dissolved in 300 ml of methanol/water (4/6), and 81 g of aqueous 37% solution of formalin were added thereto. Afterwards, these were reacted at 40° C. for 24 hours. The reaction mixture was diluted with 500 ml of water and neutralized with acetic acid. The pale yellow solid thus precipitated was taken out by filtration and washed with water to obtain 35 g of 2,6-bis(3'-methyl-4'-hydroxy-5'-hydroxymethylbenzyl)-p-cresol.

To 20.5 g of the thus-obtained 2,6-bis(3'-methyl-4'-hydroxy-5'-hydroxymethylbenzyl)-p-cresol, added were 56.5 g of phenol and 200 ml of methanol, and 3 g of 36% hydrochloric acid were added thereto and heated under reflux for 7 hours. Afterwards, the reaction mixture was put into 3 liters of water, and the pale brown solid thus precipitated was purified by column chromatography (filler: silica gel, eluent: hexane/ethyl acetate =3/1). Thus, 12 g of a white solid was obtained, and its structure was identified by NMR.

14.02 g of the thus-obtained white solid, 13.43 g of 1,2-naphthoquinonediazido-5-sulfonyl chloride, 250 ml of acetone and 10 ml of distilled water were put into a four-neck flask equipped with a stirrer, a reflux condenser, a thermometer and a dropping device, and these were dissolved therein. To this, dropwise added were 25 ml of acetone solution containing 5.27 g of triethylamine at room temperature over a period of 35 minutes, and these were reacted for further 3 hours. 3.14 g of acetic acid were added to the reaction mixture, which was then poured into 3 liters of distilled water. The yellow precipitate thus formed was taken out by filtration, washed with water and dried to obtain 23.2 g of radiation ray sensitive compound (139A). Analysis of the compound by high performance liquid chromatography revealed it to comprise 37% of diester and 21% of triester.

PRODUCTION EXAMPLE 10

Production of Radiation ray sensitive Compound (153A):

The same process as in Production Example 9 was repeated, except that 50.5 g of 4,6-bis(hydroxybenzyl)-2-methylphenol were used in place of 50.5 g of 2,6-bis (hydroxybenzyl)-p-cresol, to obtain 22.5 g of radiation ray sensitive compound (153A) as a yellow solid. Analysis of the compound by high performance liquid chromatography revealed it to comprise 39% of diester and 20% of triester.

PRODUCTION EXAMPLE 11

Production of Radiation ray sensitive Compound (144A):

16.8 g of 2,6-bis(hydroxymethyl)-p-cresol and 91.8 g of bis(3-methyl-4-hydroxyphenyl)methane (made by Honshu Chemical Industry Co.) were dissolved in 200 ml of methanol, and 6.1 g of 36% hydrochloric acid were added thereto. These were then reacted for 24 hours, while being heated under reflux. The reaction mixture was put into 3 liters of water. The viscous solid thus precipitated was washed with water and then purified by column chromatography (filler: silica gel, eluent: hexane/ethyl acetate =2/1). Thus, 28 g of a white solid was obtained, and its structure was identified by NMR.

14.72 g of the thus-obtained white solid, 13.43 g of 1,2-naphthoquinonediazido-5-sulfonyl chloride, 250 ml of acetone and 10 ml of distilled water were put into a four-neck flask equipped with a stirrer, a reflux condenser, a thermometer and a dropping device, and these were dissolved therein. To this, dropwise added were 25 ml of acetone solution containing 5.27 g of triethylamine at room temperature over a period of 35 minutes, and these were reacted for further 3 hours. 3.14 g of acetic acid were added to the reaction mixture, which was then poured into 3 liters of distilled water. The yellow precipitate thus formed was taken out by filtration, washed with water and dried to obtain 23.8 g of radiation ray sensitive compound (144A). Analysis of the compound by high performance liquid chromatography revealed it to comprise 32% of diester and 25% of triester.

The following examples illustrate the production of novolak resins for use in the present invention.

REFERENTIAL EXAMPLE 1

Production of Novolak Resin (a):

50 g of m-cresol, 50 g of p-cresol, 45.5 g of aqueous 37% solution of formalin and 0.05 g of oxalic acid di-hydrate were put into a three-neck flask equipped with a stirrer, a reflux condenser and a thermometer, heated up to 100° C. while stirring, and reacted for 10 hours. After thus reacted, the reaction mixture was cooled to room temperature, the reflux condenser was removed, and the pressure in the flask was reduced to 25 mmHg.

Next, this was gradually heated up to 160° C., and water and the non-reacted monomers were removed. Thus, 73 g of novolak resin (a) were obtained. Analysis of the resin by GPC revealed that its Mw was 6540 and the degree of its dispersion was 7.4.

REFERENTIAL EXAMPLE 2

Production of Novolak Resin (b):

44 g of novolak resin (a) were dissolved in 400 ml of MEK, then 1600 ml of cyclohexane were added thereto and heated up to 60° C. while stirring. The resulting solution was left at room temperature for 16 hours, from which a precipitate formed. The precipitate was taken out by filtration and dried in a vacuum oven at 50° C. to obtain about 15 g of novolak resin (b). Analysis of the resin by GPC revealed that its Mw was 8720 and the degree of its dispersion was 4.3.

REFERENTIAL EXAMPLE 3

Production of Novolak Resin (c):

456.6 g of m-cresol, 295.8 g of p-cresol and 404.35 g of aqueous 37% solution of formalin were put into a three-neck flask equipped with a stirrer, a reflux condenser and a thermometer, and stirred while being heated in an oil bath at 110° C. After the internal temperature reached 90° C., 1.03 g of oxalic acid di-hydrate were added. Afterwards, the reaction was continued under reflux for 15 hours, then the temperature of the oil bath was elevated up to 200° C., the reflux condenser was removed, and water and the non-reacted monomers were removed under reduced pressure to obtain 565 g of novolak resin (c). Analysis of the resin by GPC revealed that its Mw was 8860 and the degree of its dispersion was 7.7.

REFERENTIAL EXAMPLE 4

Production of Novolak Resin (d):

44 g of novolak resin (c) were dissolved in 280 ml of acetone and 175 ml of toluene, then 180 ml of hexane were added thereto and heated up to 40° C. while stirring. The resulting solution was left at room temperature for 16 hours, from which a precipitate formed. The precipitate was taken out by filtration and dried in a vacuum oven at 50° C. to obtain about 15 g of novolak resin (d). Analysis of the resin by GPC revealed that its Mw was 11400 and the degree of its dispersion was 3.9.

REFERENTIAL EXAMPLE 5

Production of Novolak resin (e):

50 g of m-cresol, 25 g of p-cresol, 28 g of 2,5-xylenol and 53 g of formalin (aqueous 37% solution) were put into a 500-ml three neck flask equipped with a stirrer and a reflux condenser, and well stirred while being heated in an oil bath at 110° C. 0.15 g of oxalic acid were added thereto and stirred under heat for 15 hours.

Next, this was heated up to 200° C. and distilled for 2 hours while gradually reducing the pressure to 1 to 2 mmHg, whereby the non-reacted monomers, water, formaldehyde, oxalic acid, etc. were removed. The temperature was lowered to room temperature, and 81 g of novolak resin (e) were obtained. Analysis of the resin by GPC revealed that its Mw was 4400 and the degree of its dispersion was 6.5

REFERENTIAL EXAMPLE 6

Production of Novolak Resin (f):

20 g of novolak resin (e) were dissolved in 60 g of methanol. To this, gradually added were 30 g of distilled water with stirring, to give a resin component as a precipitate. The upper layer of the separated two layers was removed by decantation. 30 g of methanol were added to the lower layer so as to dissolve it. 40 g of distilled water were gradually added thereto with stirring, to give a resin component as a precipitate. The upper layer of the separated layers was removed by decantation, and the thus-recovered resin component was heated and dried in a vacuum drier at 40° C. for 24 hours to obtain 7 g of novolak resin (f). Analysis of the resin by GPC revealed that its Mw was 9860 and the degree of its dispersion was 2.80.

REFERENTIAL EXAMPLE 7

Production of Novolak Resin (g):

14.4 g of methylenebis-p-cresol, 2.2 g of o-cresol, 70.2 g of 2,3-dimethylphenol, 27.2 g of 2,3,5-trimethylphenol and 9.77 g of 2,6-dimethylphenol were mixed with 50 g of diethylene glycol monomethyl ether and put into a three-neck flask equipped with a stirrer, a reflux condenser and a thermometer. Next, 85.2 g of aqueous 37% solution of formalin were added thereto and stirred while being heated in an oil bath at 110° C. After the internal temperature reached 90° C., 6.2 g of oxalic acid di-hydrate were added. Afterwards, the reaction was continued for 18 hours while keeping the temperature of the oil bath at 130° C. Then, the reflux condenser was removed, and the reaction mixture was distilled under reduced pressure at 200° C. to remove the non-reacted monomers therefrom. The thus-obtained novolak resin had Mw of 3530 and a degree of dispersion of 2.25.

REFERENTIAL EXAMPLE 8

Production of Novolak Resin (h):

8.1 g of p-cresol, 6.6 g of o-cresol, 119.1 g of 2,3-dimethylphenol, 40.8 g of 2,3,5-trimethylphenol and 11 g of 2,6-dimethylphenol were mixed with 73.5 g of diethylene glycol monomethyl ether and put into a three-neck flask equipped with a stirrer, a reflux condenser and a thermometer. Next, 133.8 g of aqueous 37% solution of formalin were added thereto and stirred while being heated in an oil bath at 110° C. After the internal temperature reached 90° C., 9.3 g of oxalic acid di-hydrate were added. Afterwards, the reaction was continued for 18 hours while keeping the temperature of the oil bath at 130° C. Then, the reflux condenser was removed, and the reaction mixture was distilled under reduced pressure at 200° C. to remove the non-reacted monomers therefrom. The thus-obtained novolak resin had Mw of 3830 and a degree of dispersion of 2.36.

REFERENTIAL EXAMPLE 9

Production of Radiation ray sensitive Compound (A):

10 g of 2,3,4,4'-tetrahydroxybenzophenone, 41 g of 1,2-naphthoquinonediazido-5-sulfonyl chloride and 400 ml of γ-butyrolactone were put into a three-neck flask and uniformly dissolved. Next, a mixture of triethylamine/acetone (=17 g/40 ml) was gradually and dropwise added thereto and reacted at 25° C. for 3 hours. The reaction mixture was poured into 1000 ml of aqueous 1solution of hydrochloric acid, and the precipitate thus formed was taken out by filtration, washed with water and methanol and dried at 40° C. to obtain radiation ray sensitive compound (A). The product was analyzed by high performance liquid chromatography (HPLC). From the peak areas appeared on the chart of the absorbance at 254 nm, the product was identified to be a mixture comprising 81% of tetraester and 5% of triester and containing other low-substituted substances as the balance.

REFERENTIAL EXAMPLE 10

Production of Radiation ray sensitive Compound (B):

10 g of 3,3,3',3'-tetramethyl-1,1'-spirobiindane-5,6,7,5',6', 7'-hexol 32 5 g of 1,2-naphthoquinonediazido-5-sulfonyl chloride and 500 ml of acetone were put into a three-neck flask and uniformly dissolved. Next, a mixture of triethylamine/acetone (=13.7 g/50 ml) was gradually and dropwise added thereto and reacted at 25° C. for 3 hours. The reaction mixture was poured into 1500 ml of aqueous 1% solution of hydrochloric acid, and the precipitate thus formed was taken out by filtration, washed with water and methanol and dried at 40° C. to obtain radiation ray sensitive compound (B). Analysis of the product by HPLC revealed it to comprise 86% of hexaester, and other low-substituted substances as the balance.

REFERENTIAL EXAMPLE 11

Production of Radiation ray sensitive Compound (C):

10 g of 2,6-bis(2,3,4-trihydroxybenzyl)-p-cresol, 50.4 g of 1,2-naphthoquinonediazido-5-sulfonyl chloride and 500 ml of γ-butyrolactone were put into a three-neck flask and uniformly dissolved. Next, a mixture of triethylamine/ acetone (=20.7 g/30 ml) was gradually and dropwise added thereto and reacted at 20° C. for 10 hours. The reaction mixture was poured into 1500 ml of aqueous 1% solution of hydrochloric acid, and the precipitate thus formed was taken out by filtration, washed with water and methanol and dried at 40° C. to obtain radiation ray sensitive compound (C). Analysis of the product by HPLC revealed it to comprise 25% of heptaester, 58% of hexaester, and other low-substituted substances as the balance.

The following examples illustrate formulations of the radiation ray sensitive resin composition of the present invention, which were prepared by combining one of the novolak resins produced in the above-mentioned Referential Examples, the radiation ray sensitive component defined by the present invention and a pre-determined low-molecular compound; while the following comparative examples illustrate comparative resists.

EXAMPLES 1 TO 49 AND COMPARATIVE EXAMPLES 1 TO 37

One of novolak resins (a) to (h) obtained in the above-mentioned Referential Examples 1 to 8, the radiation ray sensitive compound (A) and the radiation ray sensitive compound (B) defined by the present invention, and the low-molecular compound shown in Table 1 below were mixed in the amounts indicated in Table 1. Radiation ray sensitive compounds (A) to (C) produced in the above-mentioned Referential Examples 9 to 11 were used to prepare comparative resists. The mixtures each were dissolved in 18 g of ethyl lactate and 4.5 g of ethoxyethyl propionate and filtered through a micro-filter having a pore size of 0.1 μm to obtain radiation ray sensitive resin compositions. Table 2 below shows the compositions of the radiation ray sensitive compounds (A) and (B) referred to in Table 1, indicating the proportions of diester, triester and tetraester fractions of naphthoquinonediazido-5-sulfonic acid ester. Each of the thus-prepared radiation ray sensitive resin compositions was coated on a silicon wafer, using a spinner, and dried on a vacuum adsorbing hot plate at 90° C. for 60 seconds to form a resist film having a thickness of 0.98 μm on the wafer. This was exposed, using a reduction-projecting exposer (NSR-2005i9C; made by Nicon Co.), then heated on a vacuum adsorbing hot plate at 110° C. for 90 seconds, thereafter developed with an aqueous 2.38% solution of tetramethylammonium hydroxide, rinsed in water for 30 seconds and dried.

The resist patterns thus formed on the silicon wafer were observed with a scanning electronic microscope to evaluate the radiation ray sensitive resin compositions used. The results are shown in Table 1.

The sensitivity was defined by the exposure amount needed for reproducing the mask pattern of 0.5 μm.

To evaluate the latitude for development, the samples were developed for different periods of time of 40 seconds and 90 seconds. The ratio of the two sensitivities defined above indicates the latitude for development. The nearer to 1.0 the value, the broader the latitude for development. The samples having a broader latitude for development are better.

The resolution represents a limiting resolution at the exposure amount needed for reproducing the mask pattern of 0.5 μm. To evaluate the film thickness dependence, each radiation ray sensitive composition sample was coated on a silicon wafer to form a resist film having a thickness of 1.00 μm, this was exposed and developed in the same manner as above. The ratio of the resolution of the film having a thickness of 0.98 μm to that having a thickness of 1.00 μm was obtained to indicate the film thickness dependence of the sample. The nearer to 1.0 the value, the smaller the film thickness dependence. The samples having smaller film thickness dependence are better.

To determine the resist residue after development, the developed sample was observed with a scanning electronic microscope. "C" means that some resist residue remained between the lines of the resist pattern formed, while "A" means that no resist residue remained.

To evaluate the heat resistance, the silicon wafer having a resist pattern formed thereon was heated on a hot plate for 4 minutes while observing the deformation, if any, of the pattern. The heat resistance was represented by the temperature at which the pattern did not deform.

TABLE 1

Resin Compositions and Their Properties

| Example No. | Water-insoluble, alkali-soluble resin (g) | Water-insoluble, alkali-soluble low-molecular compound (g) | Radiation ray sensitive compound (A) (g) | Radiation ray sensitive compound (B) (g) | Sensitivity (mj/cm²) | Latitude for development | Resolution (μm) | Film thickness dependence | Resist residue after development | Heat resistance (°C.) |
|---|---|---|---|---|---|---|---|---|---|---|
| Ex. 1 | novolak resin (h) 4.37 | compound (268) 1.02 | (2C) 0.63 | (140A) 1.47 | 226 | 0.93 | 0.31 | 0.91 | A | 130 |
| Ex. 2 | novolak resin (h) 4.25 | compound (268) 1.00 | (2C) 0.68 | (140A) 1.57 | 260 | 0.92 | 0.30 | 0.94 | A | 130 |
| Ex. 3 | novolak resin (h) 4.37 | compound (268) 1.02 | (3C) 0.63 | (140A) 1.47 | 234 | 0.92 | 0.30 | 0.92 | A | 132 |
| Ex. 4 | novolak resin (h) 4.37 | compound (268) 0.96 | (1A) 0.65 | (140A) 1.53 | 218 | 0.94 | 0.31 | 0.94 | A | 130 |
| Ex. 5 | novolak | compound | (133A) 0.45 | (140A) 1.80 | 202 | 0.90 | 0.31 | 0.89 | A | 130 |

TABLE 1-continued

Resin Compositions and Their Properties

| Example No. | Water-insoluble, alkali-soluble resin (g) | Water-insoluble, alkali-soluble low-molecular compound (g) | Radiation ray sensitive compound (A) (g) | Radiation ray sensitive compound (B) (g) | Sensitivity (mj/cm$^2$) | Latitude for development | Resolution (μm) | Film thickness dependence | Resist residue after development | Heat resistance (°C.) |
|---|---|---|---|---|---|---|---|---|---|---|
| | resin (h) 4.25 | (268) 1.00 | | | | | | | | |
| Ex. 6 | novolak resin (h) 4.24 | compound (268) 0.93 | (133A) 0.93 | (140A) 1.40 | 190 | 0.92 | 0.32 | 0.91 | A | 135 |
| Ex. 7 | novolak resin (h) 4.37 | compound (268) 0.96 | (6A) 0.65 | (140A) 1.53 | 222 | 0.92 | 0.31 | 0.92 | A | 130 |
| Ex. 8 | novolak resin (h) 4.25 | compound (268) 1.00 | (12A) 0.68 | (140A) 1.57 | 242 | 0.95 | 0.31 | 0.94 | A | 130 |
| Ex. 9 | novolak resin (h) 4.24 | compound (268) 1.01 | (23A) 0.67 | (140A) 1.58 | 246 | 0.94 | 0.30 | 0.93 | A | 132 |
| Ex. 10 | novolak resin (h) 4.37 | compound (268) 0.96 | (52A) 0.65 | (140A) 1.53 | 250 | 0.92 | 0.30 | 0.92 | A | 130 |
| Ex. 11 | novolak resin (h) 4.37 | compound (268) 1.02 | (71A) 0.63 | (140A) 1.47 | 254 | 0.90 | 0.31 | 0.89 | A | 132 |
| Ex. 12 | novolak resin (h) 4.37 | compound (268) 0.96 | (79A) 0.87 | (140A) 1.30 | 218 | 0.94 | 0.31 | 0.95 | A | 135 |
| Ex. 13 | novolak resin (h) 4.37 | compound (268) 6.96 | (80A) 0.65 | (110A) 1.53 | 206 | 0.90 | 0.31 | 0.90 | A | 135 |
| Ex. 14 | novolak resin (h) 4.25 | compound (268) 1.00 | (87O) 0.45 | (140A) 1.80 | 230 | 0.91 | 0.30 | 0.93 | A | 135 |
| Ex. 15 | novolak resin (h) 4.24 | compound (268) 0.93 | (109A) 0.93 | (140A) 1.40 | 210 | 0.94 | 0.31 | 0.90 | A | 133 |
| Ex. 16 | novolak resin (h) 4.24 | compound (268) 0.93 | (113A) 0.93 | (140A) 1.40 | 234 | 0.90 | 0.30 | 0.91 | A | 135 |
| Ex. 17 | novolak resin (h) 4.26 | compound (268) 1.06 | (133A) 0.87 | (139A) 1.31 | 226 | 0.94 | 0.30 | 0.93 | A | 137 |
| Ex. 18 | novolak resin (h) 4.26 | compound (268) 1.06 | (133A) 0.87 | (153A) 1.31 | 218 | 0.95 | 0.31 | 0.90 | A | 137 |
| Ex. 19 | novolak resin (h) 4.26 | compound (268) 1.06 | (133A) 0.87 | (179A) 1.31 | 242 | 0.94 | 0.30 | 0.94 | A | 14.0 |
| Ex. 20 | novolak resin (h) 4.26 | compound (268) 1.06 | (133A) 0.87 | (144A) 1.31 | 210 | 0.93 | 0.31 | 0.92 | A | 137 |
| Ex. 21 | novolak resin (h) 4.26 | compound (268) 1.06 | (133A) 0.87 | (161A) 1.31 | 214 | 0.90 | 0.31 | 0.93 | A | 138 |
| Ex. 22 | novolak resin (h) 4.25 | compound (268) 1.00 | (133A) 0.68 | (180A) 1.57 | 250 | 0.91 | 0.30 | 0.89 | A | 140 |
| Ex. 23 | novolak resin (h) 4.25 | compound (268) 1.00 | (133A) 0.68 | (185A) 1.57 | 258 | 0.89 | 0.30 | 0.90 | A | 138 |
| Ex. 24 | novolak resin (h) 4.25 | compound (268) 1.00 | (133A) 0.68 | (196A) 1.57 | 262 | 0.90 | 0.30 | 0.89 | A | 140 |
| Ex. 25 | novolak resin (h) 4.25 | compound (268) 1.00 | (133A) 0.68 | (223A) 1.57 | 260 | 0.90 | 0.31 | 0.88 | A | 143 |
| Ex. 26 | novolak resin (h) 4.37 | compound (268) 1.02 | (133A) 0.63 | (236A) 1.57 | 254 | 0.94 | 0.31 | 0.90 | A | 140 |
| Ex. 27 | novolak resin (h) 4.37 | compound (268) 1.02 | (133A) 0.63 | (249A) 1.57 | 258 | 0.92 | 0.30 | 0.91 | A | 140 |
| Ex. 28 | novolak | compound | (3C) 0.59 | (139A) 1.37 | 242 | 0.95 | 0.30 | 0.93 | A | 135 |

TABLE 1-continued

Resin Compositions and Their Properties

| Example No. | Water-insoluble, alkali-soluble resin (g) | Water-insoluble, alkali-soluble low-molecular compound (g) | Radiation ray sensitive compound (A) (g) | Radiation ray sensitive compound (B) (g) | Sensitivity (mj/cm$^2$) | Latitude for development | Resolution (μm) | Film thickness dependence | Resist residue after development | Heat resistance (°C.) |
|---|---|---|---|---|---|---|---|---|---|---|
| Ex. 29 | novolak resin (f) 3.83 | (271) 1.20 | (3C) 0.59 | (140A) 1.37 | 232 | 0.94 | 0.30 | 0.94 | A | 130 |
| Ex. 30 | novolak resin(f) 3.83 | (271) 1.20 | (3C) 0.59 | (144A) 1.37 | 214 | 0.95 | 0.31 | 0.94 | A | 133 |
| Ex. 31 | novolak resin (f) 3.83 | (271) 1.20 | (3C) 0.59 | (153A) 1.37 | 222 | 0.96 | 0.30 | 0.92 | A | 135 |
| Ex. 32 | novolak resin (f) 3.83 | (271) 1.20 | (3C) 0.59 | (179A) 1.37 | 236 | 0.94 | 0.30 | 0.96 | A | 138 |
| Ex. 33 | novolak resin (f) 3.83 | (271) 1.20 | (3C) 0.59 | (185A) 1.37 | 250 | 0.92 | 0.30 | 0.93 | A | 135 |
| Ex. 34 | novolak resin (h) 4.47 | (268) 0.85 | (23A) 0.65 | (179A) 1.52 | 230 | 0.90 | 0.32 | 0.90 | A | 130 |
| Ex. 35 | novolak resin (d) 4.47 | (268) 0.85 | (23A) 0.65 | (179A) 1.52 | 210 | 0.91 | 0.33 | 0.89 | A | 138 |
| Ex. 36 | novolak resin (g) 4.48 | (268) 0.89 | (23A) 0.65 | (179A) 1.52 | 234 | 0.88 | 0.32 | 0.88 | A | 130 |
| Ex. 37 | novolak resin (h) 4.31 | (264) 1.01 | (23A) 0.65 | (179A) 1.52 | 246 | 0.92 | 0.32 | 0.95 | A | 130 |
| Ex. 38 | novolak resin (h) 4.10 | (266) 1.22 | (23A) 0.65 | (179A) 1.52 | 238 | 0.96 | 0.30 | 0.97 | A | 132 |
| Ex. 39 | novolak resin (h) 4.37 | (268) 0.96 | (23A) 0.65 | (179A) 1.52 | 252 | 0.97 | 0.31 | 0.96 | A | 135 |
| Ex. 40 | novolak resin (h) 4.37 | (278) 0.96 | (23A) 0.65 | (179A) 1.52 | 260 | 0.92 | 0.30 | 0.94 | A | 130 |
| Ex. 41 | novolak resin (h) 4.47 | (285) 0.85 | (23A) 0.65 | (179A) 1.52 | 234 | 0.94 | 0.32 | 0.91 | A | 137 |
| Ex. 42 | novolak resin (h) 4.37 | (288) 0.96 | (23A) 0.65 | (179A) 1.52 | 242 | 0.93 | 0.32 | 0.92 | A | 135 |
| Ex. 43 | novolak resin (h) 4.58 | (290) 0.75 | (23A) 0.65 | (179A) 1.52 | 226 | 0.91 | 0.32 | 0.91 | A | 143 |
| Ex. 44 | novolak resin (f) 4.10 | (266) 1.22 | (2A) 0.65 | (140A) 1.52 | 226 | 0.95 | 0.31 | 0.96 | A | 130 |
| Ex. 45 | novolak resin (f) 4.10 | (266) 1.22 | (2B) 0.65 | (140A) 1.52 | 266 | 0.89 | 0.33 | 0.87 | A | 135 |
| Ex. 46 | novolak resin (f) 4.10 | (266) 1.22 | (2L) 0.65 | (140A) 1.52 | 210 | 0.64 | 0.31 | 0.98 | A | 132 |
| Ex. 47 | novolak resin (f) 4.10 | (266) 1.22 | (87A) 0.65 | (140A) 1.52 | 218 | 0.96 | 0.31 | 0.95 | A | 135 |
| Ex. 48 | novolak resin (f) 4.10 | (266) 1.22 | (87B) 0.65 | (140A) 1.52 | 260 | 0.91 | 0.31 | 0.88 | A | 138 |
| Ex. 49 | novolak resin (f) 4.10 | (266) 1.22 | (87C) 0.65 | (140A) 1.52 | 202 | 0.95 | 0.32 | 0.93 | A | 135 |
| Comp. Ex. 1 | novolak resin (a) 4.37 | (268) 1.04 | (20) 6.63 | (140A) 1.47 | 136 | 0.68 | 0.45 | 0.70 | C | 110 |
| Comp. Ex. 2 | novolak | — | (2C) 0.63 | (140A)1.47 | 258 | 0.72 | 0.40 | 0.68 | A | 115 |

TABLE 1-continued

Resin Compositions and Their Properties

| Example No. | Water-insoluble, alkali-soluble resin (g) | Water-insoluble, alkali-soluble low-molecular compound (g) | Radiation ray sensitive compound (A) (g) | Radiation ray sensitive compound (B) (g) | Sensitivity (mj/cm²) | Latitude for development | Resolution (μm) | Film thickness dependence | Resist residue after development | Heat resistance (°C.) |
|---|---|---|---|---|---|---|---|---|---|---|
| | resin (a) 5.40 | | | | | | | | | |
| Comp. Ex. 3 | novolak resin (c) 4.37 | compound (268) 1.04 | (2C) 0.63 | (140A) 1.47 | 118 | 0.64 | 0.50 | 0.65 | C | 113 |
| Comp. Ex. 4 | novolak resin (c) 5.40 | — | (2C) 0.63 | (140A) 1.47 | 230 | 0.78 | 0.40 | 0.74 | A | 117 |
| Comp. Ex. 5 | novolak resin (e) 4.37 | compound (268) 1.04 | (2C) 0.63 | (140A) 1.47 | 172 | 0.68 | 0.38 | 0.75 | C | 116 |
| Comp. Ex. 6 | novolak resin (e) 5.40 | — | (2C) 0.63 | (140A) 1.47 | 270 | 0.78 | 0.36 | 0.67 | A | 119 |
| Comp. Ex. 7 | novolak resin (h) 5.40 | — | (2C) 0.63 | (140A) 1.47 | 720 | 0.54 | 0.37 | 0.65 | C | 140 |
| Comp. Ex. 8 | novolak resin (d) 5.40 | — | (2C) 0.63 | (140A) 1.47 | 640 | 0.62 | 0.40 | 0.70 | C | 145 |
| Comp. Ex. 9 | novolak resin (f) 5.40 | — | (2C) 0.63 | (140A) 1.47 | 730 | 0.58 | 0.42 | 0.66 | C | 145 |
| Comp. Ex. 10 | novolak resin (g) 5.40 | — | (2C) 0.63 | (140A) 1.47 | 750 | 0.66 | 0.40 | 0.52 | C | 140 |
| Comp. Ex. 11 | novolak resin (h) 5.40 | — | (2C) 0.63 | (140A) 1.47 | 735 | 0.59 | 0.40 | 0.59 | C | 140 |
| Comp. Ex. 12 | novolak resin (h) 4.42 | compound (285) 1.00 | (2C) 2.10 | — | 275 | 0.63 | 0.36 | 0.70 | C | 118 |
| Comp. Ex. 13 | novolak resin (h) 4.42 | compound (285) 1.00 | (3C) 2.10 | — | 288 | 0.58 | 0.36 | 0.67 | C | 117 |
| Comp. Ex. 14 | novolak resin (h) 4.42 | compound (285) 1.00 | (6A) 2.10 | — | 306 | 0.62 | 0.37 | 0.64 | C | 118 |
| Comp. Ex. 15 | novolak resin (h) 4.42 | compound (285) 1.00 | (38A) 2.10 | — | 388 | 0.61 | 0.36 | 0.62 | C | 120 |
| Comp. Ex. 16 | novolak resin (h) 4.42 | compound (285) 1.00 | (52A) 2.10 | — | 296 | 0.60 | 0.38 | 0.65 | C | 116 |
| Comp. Ex. 17 | novolak resin (h) 4.42 | compound (285) 1.00 | (70A) 2.10 | — | 298 | 0.65 | 0.38 | 0.54 | A | 115 |
| Comp. Ex. 18 | novolak resin (h) 4.42 | compound (285) 1.00 | (79A) 2.10 | — | 172 | 0.70 | 0.37 | 0.79 | A | 118 |
| Comp. Ex. 19 | novolak resin (h) 4.42 | compound (285) 1.00 | (80A) 2.10 | — | 158 | 0.68 | 0.39 | 0.81 | A | 120 |
| Comp. Ex. 20 | novolak resin (h) 4.42 | compound (285) 1.00 | (87C) 2.10 | — | 162 | 0.66 | 0.37 | 0.76 | A | 118 |
| Comp. Ex. 21 | novolak resin (h) 4.42 | compound (285) 1.00 | (109A) 2.10 | — | 144 | 0.61 | 0.38 | 0.82 | A | 120 |
| Comp. Ex. 22 | novolak resin (h) 4.42 | compound (285) 1.00 | (113A) 2.10 | — | 170 | 0.68 | 0.37 | 0.68 | A | 123 |
| Comp. Ex. 23 | novolak resin (h) 4.42 | compound (285) 1.00 | (133A) 2.10 | — | 140 | 0.61 | 0.42 | 0.70 | A | 120 |
| Comp. Ex. 24 | novolak resin (h) 4.42 | compound (285) 1.00 | — | (139A) 2.10 | 240 | 0.72 | 0.37 | 0.75 | A | 138 |
| Comp. Ex. | novolak | compound | — | (140A) 2.10 | 252 | 0.70 | 0.38 | 0.76 | A | 135 |

TABLE 1-continued

Resin Compositions and Their Properties

| Example No. | Water-insoluble, alkali-soluble resin (g) | Water-insoluble, alkali-soluble low-molecular compound (g) | Radiation ray sensitive compound (A) (g) | Radiation ray sensitive compound (B) (g) | Sensitivity (mj/cm²) | Latitude for development | Resolution (μm) | Film thickness dependence | Resist residue after development | Heat resistance (°C.) |
|---|---|---|---|---|---|---|---|---|---|---|
| 25 | resin (h) 4.42 | (285) 1.00 | | | | | | | | |
| Comp. Ex. 26 | novolak resin (h) 4.42 | compound (285) 1.00 | — | (144A) 2.10 | 246 | 0.68 | 0.36 | 0.72 | A | 137 |
| Comp. Ex. 27 | novolak resin (h) 4.42 | compound (285) 1.00 | — | (153A) 2.10 | 236 | 0.72 | 0.38 | 0.73 | A | 140 |
| Comp. Ex. 28 | novolak resin (h) 4.42 | compound (285) 1.00 | — | (179A) 2.10 | 266 | 0.74 | 0.35 | 0.78 | A | 145 |
| Comp. Ex. 29 | novolak resin (h) 4.42 | compound (285) 1.00 | — | (185A) 2.10 | 274 | 0.70 | 0.34 | 0.79 | A | 145 |
| Comp. Ex. 30 | novolak resin (h) 4.42 | compound (285) 1.00 | (2B) 0.63 | (139A) 1.47 | 330 | 0.72 | 0.34 | 0.62 | C | 135 |
| Comp. Ex. 31 | novolak resin (h) 4.42 | compound (285) 1.00 | (3B) 0.63 | (139A) 1.47 | 342 | 0.70 | 0.33 | 0.66 | C | 135 |
| Comp. Ex. 32 | novolak resin (h) 4.42 | compound (285) 1.00 | (87B) 0.63 | (139A) 1.47 | 380 | 0.76 | 0.33 | 0.60 | C | 138 |
| Comp. Ex. 33 | novolak resin (h) 4.42 | compound (285) 1.00 | Radiation-sensitive compound A 0.63 | (139A) 1.47 | 230 | 0.74 | 0.37 | 0.78 | A | 115 |
| Comp. Ex. 34 | novolak resin (h) 4.42 | compound (285) 1.00 | Radiation-sensitive compound B 0.63 | (139A) 1.47 | 288 | 0.63 | 0.38 | 0.58 | C | 135 |
| Comp. Ex. 35 | novolak resin (h) 4.42 | compound (285) 1.00 | Radiation-sensitive compound C 0.63 | (139A) 1.47 | 322 | 0.58 | 0.39 | 0.63 | C | 130 |
| Comp. Ex. 36 | novolak resin (h) 4.37 | trihydroxy-benzo-phenone 1.04 | (2C) 0.63 | (139A) 1.47 | 172 | 0.74 | 0.40 | 0260 | C | 120 |
| Comp. Ex. 37 | novolak resin (h) 4.37 | trihydroxy-benzo-phenone 1.04 | (2C) 0.63 | (139A) 1.47 | 164 | 0.76 | 0.42 | 0.58 | C | 130 |

TABLE 2-1

Compositions of Esters

| Radiation ray sensitive Compound | Skeleton Compound | Diester | Triester | Tetraester |
|---|---|---|---|---|
| (1A) | Compound (1) | 71% | 22% | |
| (2A) | Compound (2) | 59 | 24 | |
| (2B) | Compound (2) | 20 | 75 | |
| (2C) | Compound (2) | 88 | 3.5 | |
| (3A) | Compound (3) | 61 | 35 | |
| (3B) | Compound (3) | 18 | 77 | |
| (3C) | Compound (3) | 82 | 3 | |
| (6A) | Compound (6) | 64 | 30 | |
| (12A) | Compound (12) | 73 | 20 | |
| (22A) | Compound (22) | 67 | 27 | |
| (23A) | Compound (23) | 75 | 19 | |
| (28A) | Compound (38) | 46 | 39 | |
| (52A) | Compound (52) | 57 | 28 | |
| (70A) | Compound (70) | 40 | 40 | |
| (71A) | Compound (71) | 68 | 29 | |
| (79A) | Compound (79) | 38 | 48 | 5% |
| (80A) | Compound (80) | 49 | 22 | 3 |
| (87A) | Compound (87) | 53 | 33 | 7 |
| (87B) | Compound (87) | 22 | 63 | 12 |
| (87C) | Compound (87) | 78 | 14 | 3 |
| (109A) | Compound (109) | 39 | 32 | 16 |
| (113A) | Compound (113) | 51 | 23 | 5 |
| (133A) | Compound (133) | 36 | 36 | 14 |

TABLE 2-2

| Radiation ray sensitive Compound | Skeleton Compound | Percentage (%) of Hydrogen Atoms in D (as percentage in raw material fed in the reactor) |
|---|---|---|
| (140A) | Compound (140) | 58% |
| (161A) | Compound (161) | 60 |
| (179A) | Compound (179) | 66.7 |
| (180A) | Compound (180) | 65 |
| (185A) | Compound (185) | 63 |
| (196A) | Compound (196) | 64 |
| (223A) | Compound (223) | 65 |
| (236A) | Compound (236) | 61 |
| (249A) | Compound (249) | 67 |

As is obvious from the results shown above, the resist samples satisfying the requirements of the present invention had low film thickness dependence and gave a small resist residue after development, while having a high resolution. In addition, these were superior to any of the comparative resists, as having a broader latitude for development and having higher heat resistance.

As has been described in detail hereinabove, the radiation ray sensitive resin composition of the present invention is characterized in that it has low film thickness dependence, it leaves a small resist residue after development, it has a high resolution, it has a broad latitude for development and it has high heat resistance. Therefore, the composition is most suitably used in industrial mass-production of semiconductor devices having ultra-fine circuits.

While the invention has been described in detail and with reference to specific embodiments thereof, it will be apparent to one skilled in the art that various changes and modifications can be made therein without departing from the spirit and scope thereof.

What is claimed is:

1. A radiation ray sensitive resin composition comprising a water-insoluble, alkali-soluble resin, a water-insoluble, alkali-soluble low-molecular compound and a radiation ray sensitive component, wherein 50% or more of said radiation ray sensitive component is, a mixture composed of (A) at least one naphthoquinonediazide sulfonic acid diester of water-insoluble, alkali-soluble low-molecular compounds having three and/or four phenolic hydroxyl groups of the following formulae (A1) to (A4) and (B) a naphthoquinonediazide sulfonic acid ester of a water-insoluble, alkali-soluble low-molecular compound having from 5 to 7 phenolic hydroxyl groups of the following general formula (B1), wherein said ester (B) is obtained by esterification reaction of a naphthoquinonediazide sulfonic acid with a water-insoluble, alkali-soluble low-molecular compound having from 5 to 7 phenolic hydroxyl groups and having the proportion of the naphthoquinonediazide sulfonyl groups in all hydroxyl groups of from 10 to 60%:

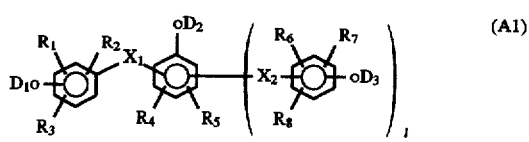

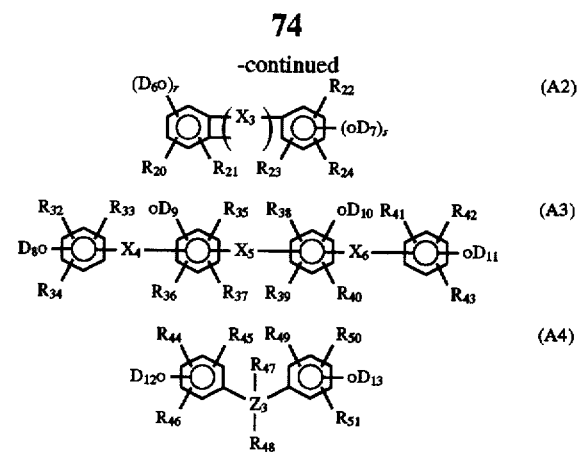

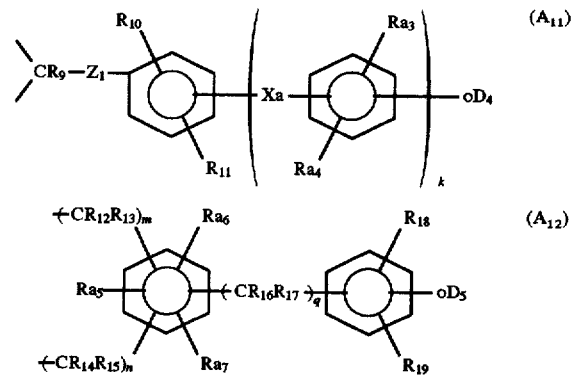

wherein;

$R_1$ to $R_8$ and $R_{20}$ to $R_{24}$ each represent a hydrogen atom, —CN, —X—$R_{a1}$ or a halogen atom;

$X_1$ and $X_2$ each represent a single bond, a carbonyl group, a sulfido group, a sulfonyl group, or —C($R_{b1}$)($R_{b2}$)—; provided that, when 1 is 0, then $X_1$ represents a group of the following general formula ($A_{11}$) or ($A_{12}$):

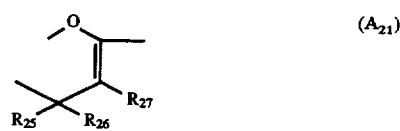

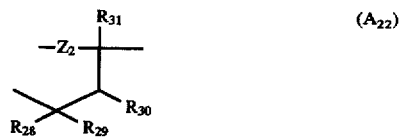

$X_3$ represents a group of the following general formula ($A_{21}$) or ($A_{22}$):

(A21)

(A22)

$R_9$, $R_{12}$ to $R_{17}$, $R_{25}$ to $R_{31}$, $R_{b1}$ and $R_{b2}$ each represent a hydrogen atom, a methyl group, an ethyl group, or a haloalkyl group having one or two carbon atoms;

$R_{b1}$ and $R_{b2}$; $R_{25}$ and $R_{26}$; $R_{28}$ and $R_{29}$; and $R_{30}$ and $R_{31}$ each may be bonded to each other to form an alicyclic hydrocarbon residue;

$R_{10}$, $R_{11}$, $R_{a3}$, $R_{a4}$, $R_{18}$ and $R_{19}$ each represent a hydrogen atom, —X—$R_{a1}$, —CN or a halogen atom;

X represents a single bond, —O—, —S—, —CO—, —OCO—, or —N($R_{a1}$)—CO—;

Xa represents a carbonyl group, a sulfido group, a sulfonyl group, or —C($R_{b1}$)($R_{b2}$)—;

$R_{a1}$ represents an alkyl, aryl or aralkyl group having from 1 to 10 carbon atoms;

75

$Z_1$ represents a single bond, or it is bonded to $CR_9$ to form a tri-valent alicyclic hydrocarbon residue;

$Z_2$ represents a single bond, or —O—;

k and l each represent 0 or 1;

m and n each represent 1 or 2;

q represents an integer of from 1 to 8;

r and s each represent 1 or 2, provided that (r+s) is 3;

$D_1$ to $D_7$ each represent a hydrogen atom, or a naphthoquinonediazido-4 or 5-sulfonyl group;

$R_{32}$ to $R_{46}$ and $R_{49}$ each represent a hydrogen atom, —CN, —X—$R_{a1}$, or a halogen atom;

$R_{47}$ represents a hydrogen atom, a methyl group, an ethyl group, a haloalkyl group having one or two carbon atoms, or Rc;

Rc represents a group of the following general formula ($A_{41}$):

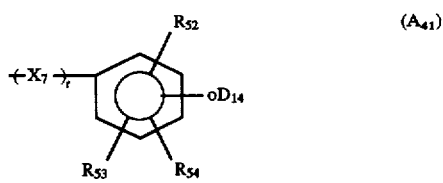

$R_{48}$ represents a hydrogen atom, a methyl group, an ethyl group, a haloalkyl group having one or two carbon atoms, or Rd;

Rd represents a group of the following general formula ($A_{42}$):

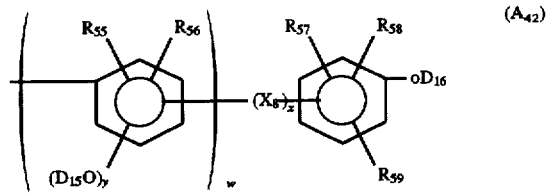

$R_{50}$ and $R_{51}$ each represent a hydrogen atom, —CN, —X—$R_{a1}$, or a halogen atom; provided that, when $R_{47} \neq c$ and is Rd, then they each are Rc;

$X_4$ to $X_6$ each represent a single bond, a carbonyl group, a sulfido group, a sulfonyl group, or —C($R_{b1}$)($R_{b2}$)—;

$X_7$ and $X_8$ each represent a single bond, or a group of —($CR_{160}R_{61}$)$_u$(CH=CH)$_v$;

$R_{52}$ to $R_{59}$ and $R_{a5}$ to $R_{a7}$ each represent a hydrogen atom, —CN, —X—$R_{a1}$, or a halogen atom;

$R_{60}$ and $R_{61}$ each represent a hydrogen atom, a methyl group, an ethyl group, or a haloalkyl group having one or two carbon atoms;

$Z_3$ represents a tetra-valent alkyl residue having from 1 to 6 carbon atoms;

$D_8$ to $D_{16}$ each represent a hydrogen atom, or a naphthoquinonediazido-4 or 5-sulfonyl group;

t represents 0 or an integer of 1 or 2;

u and x each represent 0 or an integer of from 1 to 8;

y, v and w each represent 0 or 1; provided that, when $R_{47} \neq Rc$ and $R_{50} \neq Rc$ and $R_{51} \neq Rc$, then y=1 and w=1, while in the other cases, y=0; and two of $D_1$ to $D_{16}$ are naphthoquinonediazido-4 or 5-sulfonyl groups in one molecule of each of these

76 radiation ray sensitive compounds of formulae (A1) to (A4):

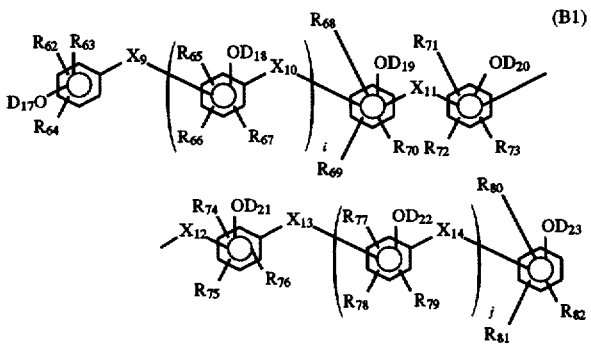

wherein;

$R_{62}$ to $R_{82}$ each represent a hydrogen atom, —CN, —X—$R_{a1}$, or a halogen atom;

$X_9$ to $X_{14}$ each represent a single bond, a carbonyl group, a sulfido group, a sulfonyl group, or a group of —C($R_{b1}$)($R_{b2}$)—;

$D_{17}$ to $D_{23}$ each represent a hydrogen atom, or a naphthoquinonediazido-4 or 5-sulfonyl group;

$R_{a1}$ represents an alkyl, aryl or aralkyl group having from 1 to 10 carbon atoms;

$R_{b1}$ and $R_{b2}$ each represents a hydrogen atom, a methyl group, an ethyl group, or a haloalkyl group having one or two carbon atoms; and $R_{b1}$ and $R_{b2}$ may be bonded to each other to form an alicyclic residue; and i and j each represent 0 or 1.

2. The radiation ray sensitive resin composition as claimed in claim 1, wherein said water-insoluble, alkali-soluble resin is at least one novolak resin produced by condensation of phenol, cresol, xylenol, trimethylphenol or a mixture of two or more of these and an aldehyde compound and has a weight-average molecular weight of from 5,500 to 25,000.

3. The radiation ray sensitive resin composition as claimed in claim 1, wherein said water-insoluble, alkali-soluble resin is at least one novolak resin produced by condensation of a mixture of p-cresol, o-cresol, 2,3-xylenol, 2,6-xylenol and trimethylphenol, and an aldehyde compound.

4. The radiation ray sensitive resin composition as claimed in claim 1, wherein said water-insoluble, alkali-soluble low-molecular compound is such that the ratio of the phenolic hydroxyl groups to the aromatic rings in one molecule is from 0.5/1 to 1.4/1, that the number of the carbon atoms in one molecule is from 12 to 50 in total, and that the compound contains from 2 to 10 phenolic hydroxyl groups in one molecule.

5. The radiation ray sensitive resin composition as claimed in claim 1, wherein the ratio of said radiation ray sensitive compound (A) to said radiation ray sensitive compound (B) is from 0.1/1 to 10/1.

* * * * *